United States Patent [19]
Date et al.

[11] Patent Number: 5,453,757
[45] Date of Patent: Sep. 26, 1995

[54] LIQUID CRYSTAL DISPLAY CONTROL SYSTEM INCLUDING STORAGE MEANS AND D/A CONVERTERS

[75] Inventors: Yoshito Date, Hyogo; Shoichi Takeshita, Kyoto; Tetsuro Ohmori, Hirakata; Junji Nakatsuka, Osaka; Yoshio Imamura, Shiga, all of Japan

[73] Assignee: Matsushita Electric Industrial Co., Ltd., Kadoma, Japan

[21] Appl. No.: 391,616

[22] Filed: Feb. 21, 1995

Related U.S. Application Data

[63] Continuation of Ser. No. 872,820, Apr. 24, 1992, abandoned.

[30] Foreign Application Priority Data

| Apr. 26, 1991 | [JP] | Japan | 3-097063 |
| Jun. 27, 1991 | [JP] | Japan | 3-156821 |
| Jul. 22, 1991 | [JP] | Japan | 3-180828 |
| Jul. 30, 1991 | [JP] | Japan | 3-189913 |
| Aug. 5, 1991 | [JP] | Japan | 3-195191 |

[51] Int. Cl.$^6$ ............................................ G09G 3/36
[52] U.S. Cl. ........................... 345/89; 341/150; 345/147
[58] Field of Search ............................. 340/784, 793, 340/811; 345/89, 98, 147; 341/150

[56] References Cited

U.S. PATENT DOCUMENTS

| 4,667,179 | 5/1987 | Law et al. | 341/150 |
| 4,872,002 | 10/1989 | Stewart et al. | 340/811 |
| 5,008,674 | 4/1991 | Da Franca et al. | 341/150 |
| 5,021,681 | 6/1991 | Colbeck et al. | 341/150 |
| 5,021,787 | 6/1991 | Leduc | 341/150 |
| 5,061,920 | 10/1991 | Nelson | 340/784 |

FOREIGN PATENT DOCUMENTS 2-264294  10/1990  Japan.

*Primary Examiner*—Jeffery Brier
*Attorney, Agent, or Firm*—Ratner & Prestia

[57] ABSTRACT

A liquid crystal display control system comprises a liquid crystal panel, a plurality of data latches for storing digital gray scale data, and a plurality of D/A converters for converting the outputs of the data latches into analog signals to be applied to the liquid crystal panel. The display data is digital signals, and the digital signals are processed up to the D/A converters just before the liquid crystal panel. Afterwards, the digital signals are converted into analog signals in the horizontal display period of relatively slow operating speed, and therefore analog circuits having many adjusting points may be reduced. Accordingly, the adjusting positions are reduced, and the adjusting process in mass production is simplified. In the case of a large screen display, in particular, although the data transfer speed is high, since the display data are digital signals, a high display quality is obtained by transferring the signals without deteriorating the display data. Moreover, the constitution is composed of digital circuits up to the D/A converters just before the liquid crystal panel, and therefore, the power consumption is small, and the economy and portability are excellent, while the mounting area is reduced, thereby realizing a liquid crystal display control system of small size and light weight.

6 Claims, 10 Drawing Sheets

LIQUID CRYSTAL DISPLAY CONTROL SYSTEM INCLUDING STORAGE MEANS AND D/A CONVERTERS

This application is a continuation of application Ser. No. 07/872,820 filed Apr. 24, 1992 now abandoned.

BACKGROUND OF THE INVENTION

The present invention relates to a liquid crystal display (LCD) control system used in televisions, personal computers, work stations or the like.

In communications appliances, information appliances, audio and visual appliances, the signal processing form is recently changing from the analog signal processing to digital data signal processing. These appliances are also in the trend of downsizing, lighter weight and smaller power consumption. As the display devices used in such appliances, the conventional cathode-ray tubes (CRTs) have been gradually replaced by thin and lightweight liquid crystal panels. For example, in personal computers, work stations, televisions, visual telephones and the like, the data signals are processed digitally, and liquid crystal panels are used as display devices, and small and lightweight appliances are realized. Speaking of liquid crystal panels, in order that the liquid crystal may replace the CRT to occupy the throne of display devices, improvement of picture quality and display of high resolution must be both achieved. In the picture quality, especially, multicolor display is demanded.

For example, if eight-bit display for each of R, G, B (16,700,000 colors) which is closer to the natural color than four-bit display for each of R, G, B (4,096 colors) is realized, a color tone as close to the natural color as the present CRT display television will be obtained, and the applications of liquid crystal panel will be expanded dramatically. As for the high resolution display, if the high resolution liquid crystal panel in the number of dots as many as the high definition television (HDTV) is realized, the liquid crystal panel will play a major role in the image field in the future.

There is hence a increasing demand for a new LCD control system applicable to the multicolor and high resolution tendency, in consideration of suitability to the digital, downsizing and lower power consumption trend of appliances and the future of the liquid crystal panel.

Hitherto, in the LCD control system for driving this type of thin film transistor (TFT) liquid crystal panel, a DA converter for converting display data into analog signal and a sample hold circuit for holding and delivering the analog signal were used.

FIG. 20 is a structural diagram of a conventional LCD control system. Its operation is described below while referring to FIG. 20.

A display controller 2 delivers a gate driver control signal 4 to a gate driver 3 for controlling the gate electrode of a TFT liquid crystal panel 1. The controlled gate driver 3 renders one line valid out of arbitrary lines of the TFT liquid crystal panel 1. The display controller 2 reads out, by a display address signal 6, display data from a video random access memory (RAM) 5 for storing the digital display data.

The display data stored in the video RAM 5 is the address data of a RAM 7, and it is converted into gray scale data (color scale data in the case of a color liquid crystal panel) to be applied to the TFT liquid crystal panel 1 by the RAM 7. This is intended to curtail the memory capacity in the video RAM 5 by storing the gray scale data large in data quantity in the RAM 7 functioning as lookup table. Meanwhile, to change the display gray scale level (or display color), it is enough to change the gray scale data of the RAM 7 only, and, advantageously, it can be changed quickly.

The converted gray scale data is converted into analog signal by a DA converter 8. Conversion into analog signal is necessary because analog signal is used for charging and discharging of the display signal to the liquid crystal capacitor attached to each pixel of the TFT liquid crystal panel 1. The display signal converted into analog signal is fed into an amplifier 10 by way of an inverting/noninverting circuit 9 composed of such analog circuit as voltage follower and the like. The inverting/noninverting circuit 9 is intended to invert the polarity of the voltage applied to the liquid crystal periodically (generally in frame period), which is an essential function for driving the liquid crystal. The amplifier 10 is to boost the analog signal delivered from the DA converter 8 up to a voltage level (about 10 V) to be applied to the TFT liquid crystal panel 1. A gain and offset control circuit 11 is to adjust the gain and Offset of the amplifier 10 so as to obtain the optimum display quality for liquid crystal display.

The TFT liquid crystal panel 1, unlike the CRT, must be driven in the horizontal period unit because the response speed of the TFT is slow. Accordingly, by holding the display signals for the portion of one line, they are produced simultaneously, which is called the line sequential driving.

A liquid crystal display signal 12 coming out of the amplifier 10 is fed into a sample hold circuit 15, and is sampled and held. The sample hold circuit 15 is same in the number of horizontal pixels as the TFT liquid crystal panel 1, and therefore the liquid crystal display signal 12 from the amplifier 10 is sampled sequentially by the sample hold circuit 15 designated by a shift register 13 operating at a low voltage (about 5 V).

The shift register 13 is the bits in the same number as the number of horizontal pixels of the TFT liquid crystal panel 1, and sequentially transfers pulse 18 generated from the display controller 2 in the horizontal direction by a transfer clock 17. The transfer pulse from the shift register 13 is boosted (to about 10 V) by a level shifter 14, and one of the sample hold circuits 15 is selected, and the liquid crystal display signal 12 is sampled. When all display signals of one line are sampled, the display controller 2 delivers an output timing signal 16 to the sample hold circuit 15, and the sample hold circuit 15 delivers an analog signal to be applied to the TFT liquid crystal panel 1. When the signal is applied to the TFT liquid crystal panel 1, one line out of arbitrary lines designated by the gate driver 3 is displayed.

In such conventional constitution of the LCD control system, however, the amplifier 10 having the gain and offset control circuit 11 is required, and in order to obtain an appropriate display quality, plural control points are needed in the gain and offset control circuit 11. Accordingly, the process required in adjustment procedure becomes a bottleneck for mass production. In the case of large-screen display, meanwhile, the data transfer speed is high, and high speed display signals pass through the DA converter 8, inverting/noninverting circuit 9 and amplifier 10, which are all analog circuits. As a result, the display signals are distorted, the display quality deteriorates, and a high resolution required for multicolor display is not obtained. Therefore, even if the DA converter 8 possesses the resolution of eight bits, the resolution after passing through the analog circuits may be lowered to about four bits to six bits.

Moreover, in the analog circuits of high speed and large amplitude, regardless of the signal level, the internal circuits possess a bias power source with a large current consumption or a reference current source, and therefore a large current is always flowing. Besides, the supply voltage of analog circuit must be sufficiently large as compared with the signal level of the analog signal to be processed in order to have a sufficient working range (dynamic range) of the operational amplifier. As a result, the analog circuits are large in power consumption, and, although the liquid crystal display device is small and light, the power supply unit becomes larger in size, and the portability is sacrificed, and the working time becomes short if working on batteries. Concerning reduction of size and weight, as compared with the digital circuit advanced in the degree of integration, the analog circuit requires a wide area for mounting to incorporate the diversified parts for composing the circuit including the resistors, capacitors and variable resistors. Thus, the conventional LCD control system involved many problems.

The invention is hence intended to solve these problems of the prior art by presenting an LCD control system reduced in the number of adjusting points, improved in mass productivity, capable of obtaining a high display quality, small in power consumption, and small in the mounting area.

SUMMARY OF THE INVENTION

The present invention relates to an LCD control system comprising a liquid crystal panel, storage means (for example latches, flip flops, memory devices, etc.) for storing digital gray scale data, and plural DA converters for converting the outputs of the storage means into analog signals to be applied to the liquid crystal panel.

In the LCD control system of the invention, the display data is digital signals, and the digital signals are processed up to the DA converter just before the liquid crystal panel. Afterwards, the digital signals are converted into analog signals in a horizontal display period slow in the operating speed relatively, and therefore the analog circuits having many adjusting points may be omitted. Accordingly, the number of adjusting points is reduced, and the adjusting processes in mass production are simplified. Besides, in particular, in the case of large screen display, although the data transfer speed is high, since the display data are digital signals, a high display quality is obtained by transferring signals without deteriorating the display data. In addition, since the structure is composed of digital circuits up to the DA converter just before the liquid crystal panel, the power consumption is small, the economy and portability are excellent, and the mounting area is reduced, so that a compact LCD control system may be realized.

DETAILED DESCRIPTION OF THE INVENTION

Figure 1:
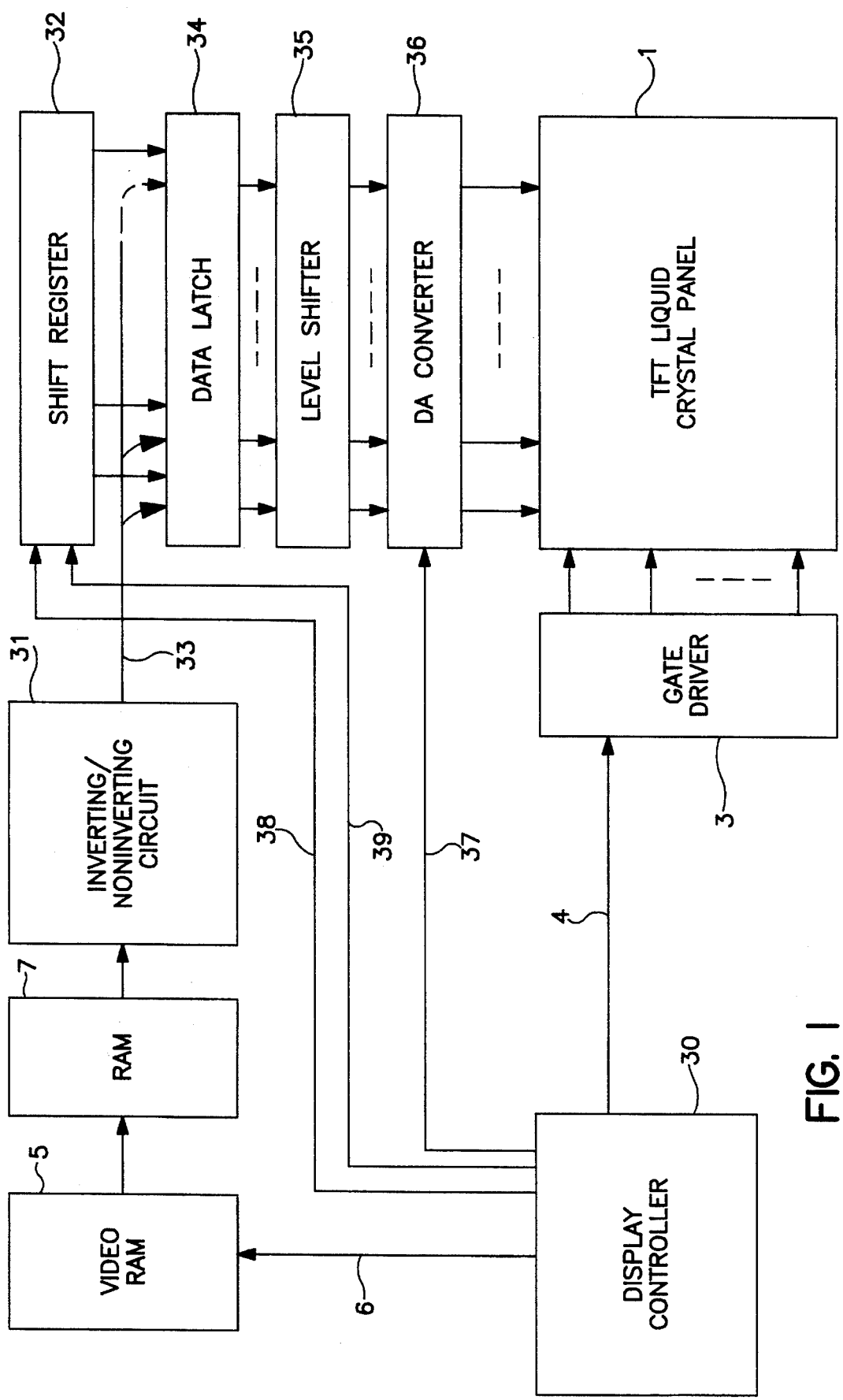
FIG. 1 is a block diagram showing the constitution of LCD control system of an embodiment of the invention.

Referring now to FIG. 1, the operation of LCD control system in an embodiment of the invention is described in detail below.

FIG. 1 shows a liquid crystal display control system in an embodiment of the invention. A display controller 30 delivers a gate driver control signal 4 to a gate driver 3, and the gate driver 3 renders valid an arbitrary line in a TFT liquid crystal panel 1. The display controller 30 reads out, by a display address signal 6, display data from a video RAM 5. The display data stored in the video RAM 5 is the address data of a RAM 7, and it is converted into gray scale data in the RAM 7. The gray scale data is converted into digital liquid crystal display data 33 after passing through an inverting/noninverting circuit 31.

The TFT liquid crystal panel 1 holds the display data for the portion of one line, and delivers simultaneously, which is called line sequential drive. The liquid crystal display data 33 produced from the inverting/noninverting circuit 31 is fed into a data latch 34, and is latched and held. Since the data latches 34 are as many as the number of horizontal pixels of the TFT liquid crystal panel 1, the liquid crystal display data from the inverting/noninverting circuit 31 are sequentially latched in the data latches 34 specified by a shift register 32.

The shift register 32 has as many bits as the number of horizontal pixels of the TFT liquid crystal, and transfers the pulse 39 generated by the display controller 30 sequentially in the horizontal direction by transfer clock 38. The pulse 39 which is the output of the shift register 32 specifies one data latch 34, and sequentially the data latch 34 latches the liquid crystal display data 33. The latched data is boosted by a level shifter 35, and fed into a DA converter 36. When all display data for the portion of oneline are completely latched, the display controller 30 delivers an output timing signal 37 to the DA converter 36, and the DA converter 36 produces an analog signal to be applied to the TFT liquid crystal panel 1. When the data is applied in the TFT liquid crystal panel 1, one line out of arbitrary lines specified by the gate driver 3 is displayed.

According to the LED control system in FIG. 1, the DA converter 36 is disposed just before the TFT liquid crystal panel 1, and the gray scale data converted by the RAM 7 is processed directly in the digital form without undergoing analog processing, and therefore high speed analog circuit and control circuit are omitted, and a display screen of high quality is obtained.

Besides, the data latches 34 are provided as many as the number of horizontal pixels of the TFT liquid crystal panel 1, and adjustment-free DA converters 36 are provided as many as the number of horizontal pixels for converting the output of the data latches 34 into analog signals to be applied to the TFT liquid crystal panel 1, so that the analog circuits are not needed, and the adjusting points required in amplifier and the like are saved, so that the mass producibility may be enhanced.

Still more, since the digital display data is converted into analog signal by the DA converter 36 just before applying signal to the pixels of the TFT liquid crystal panel 1, especially in the case of large screen display, in spite of high data transfer speed, data does not deteriorate, and is displayed in high display quality. At the same time, by transferring the display data without using analog circuits which consume much electric power, the power consumption may be saved. In addition, instead of analog circuits having a large number of parts, the display data can be transferred by the digital circuit which may be advanced in the degree of integration, and therefore; the mounting surface area is reduced, so that a compact excellent LCD control system is realized.

Figure 2:
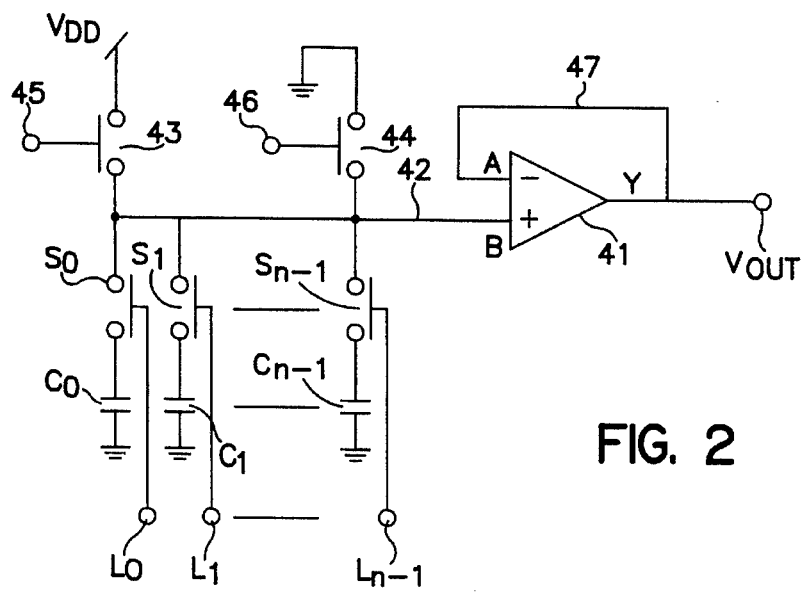
FIG. 2 is a structural diagram showing an output circuit in a first embodiment for composing the LCD control system of the invention.

Next, a first embodiment of an output circuit comprising a DA converter for composing the LCD control system of the invention is described while referring to FIG. 2.

In FIG. 2, n capacitors $C_0, C_1, \ldots, C_{n-1}$, possess a same capacitance C, and one electrode of each one of the capacitors $C_0, C_1, \ldots, C_{n-1}$ is grounded. The other electrode of each one of the capacitors $C_0, C_1, \ldots, C_{n-1}$ is connected with one terminal of each one of switches $S_0, S_1, \ldots, S_{n-1}$. The switches $S_0, S_1, \ldots, S_{n-1}$ are turned on or off by selection signals $L_0, L_1, \ldots, L_{n-1}$, respectively, while the other terminals are commonly connected.

The output circuit has a three-terminal operational amplifier 41, and an input signal 42 is fed to a noninverting input terminal B of the operational amplifier 41. The commonly connected terminals of the switches $S_0, S_1, \ldots, S_{n-1}$ are connected to the noninverting input terminal B of the operational amplifier 41. The noninverting input terminal B of the operational amplifier 41 is also connected to a power supply $V_{DD}$ through a charging switch 43, and is grounded through a discharging switch 44. The charging switch 43 is turned on or off by a charging timing signal 45, and the discharging switch 44 is turned on or off by a discharging timing signal 46. The output Y of the operational amplifier 41 is fed back to a inverting input terminal A of the operational amplifier 41 as a feedback signal 47. The output voltage from this output circuit is produced from an output terminal $V_{out}$.

The operation of thus composed output circuit of the LCD control system is explained below. First, the discharging switch 44 is turned on by the discharging timing signal 46, and the charging switch 43 is turned off by the charging timing signal 45. Next, by the selection signals $L_0, L_1, \ldots, L_{n-1}$, all switches $S_0, S_1, \ldots, S_{n-1}$ are set in ON state. As a result, the electric charge stored in all capacitors $C_0, C_1, \ldots, C_{n-1}$ is discharged.

Next, by the discharging timing signal 46, the discharging switch 44 is set in OFF state, and a specified number of swiches out of the switches $S_0, S_1, \ldots, S_{n-1}$ are set in ON state by the selection signals $L_0, L_1, \ldots, L_{n-1}$. Consequently, when the charging switch 43 is set in ON state by the charging timing signal 45, a specified number of capacitors of the capacitors $C_0, C_1, \ldots, C_{n-1}$ are charged by the specified switches out of the swiches $S_0, S_1, \ldots, S_{n-1}$ in ON state.

By the charging timing signal 45, the charging switch 43 is set in OFF state, and all switches $S_0, S_1, \ldots, S_{n-1}$ are set in ON state by the selection signals $L_0, L_1, \ldots, L_{n-1}$. As a result, all electric charge stored in a specific number of capacitors is equally distributed and averaged in all capacitors $C_0, C_1, \ldots, C_{n-1}$, and the voltage due to the averaged electric charge is generated. Thus generated voltage is fed into the noninverting input terminal B of the operational amplifier 41 as input signal 42. Since the output Y of the operational amplifier 41 is fed to the inverting input terminal A as a feedback signal 47, the operational amplifier 41 is an amplifier with gain of 0 dB, and the voltage entering the noninverting input terminal B is directly delivered to the output terminal $V_{out}$.

Supposing, for example, that specific switches out of the switches $S_0, S_1, \ldots, S_{n-1}$ are set in ON state and that A pieces of capacitor out of n capacitors $C_0, C_1, \ldots, C_{n-1}$ are charged, the stored electric charge Q may be expressed in Formula (1).

$$Q = A \times C \times V_{DD} \qquad (1)$$

After A pieces of capacitor are charged, by setting the charging switch 43 in OFF state and further setting all (i.e. N) switches $S_0, S_1, \ldots, S_{n-1}$ in ON state, since the electric charge Q is constant even after the stored electric charge is averaged, assuming the obtained voltage to be $V_0$, the following relation is established:

$$Q = N \times C \times V_0 \qquad (2)$$

Therefore, from Formula (1) and (2), we obtain $$V_0 = (A/N) \times V_{DD} \qquad (3)$$

Thus, according to the embodiment in FIG. 2, since the electric charges stored in specific capacitors from the power supply $V_{DD}$ are distributed and averaged in all capacitors $C_0$, $C_1, \ldots, C_{n-1}$, by properly selecting the number of capacitors to be charged, a required voltage may be generated without setting multiple reference voltages. Therefore, the number of wirings may be notably curtailed in the LCD control system of the invention.

As described herein, since the LCD control system having the output circuit shown in FIG. 2 possesses plural capacitors having an identical capacitance, and switches attached to the individual capacitors, the electric charge is stored in a specified number of capacitors by setting specific switches in ON state. Next, by stopping supply of electric charge to the capacitors, and distributing and averaging the stored electric charge in all capacitors, the voltage averaged by all these capacitors is obtained. By feeding this voltage into the amplifier, an output voltage proportional to the averaged voltage is obtained. In this way, in the LCD control system of the embodiment, by varying the number of switches to be set in ON state, a required voltage may be generated, and it is not necessary to set many reference voltages as in the prior art. Therefore, according to the embodiment in FIG. 2, the number of wirings and the number of circuits may be saved in the LCD control system.

Making reference to FIG. 3, a second embodiment of the output circuit comprising a DA converter for composing the LCD control system of the invention is explained below.

Figure 3:
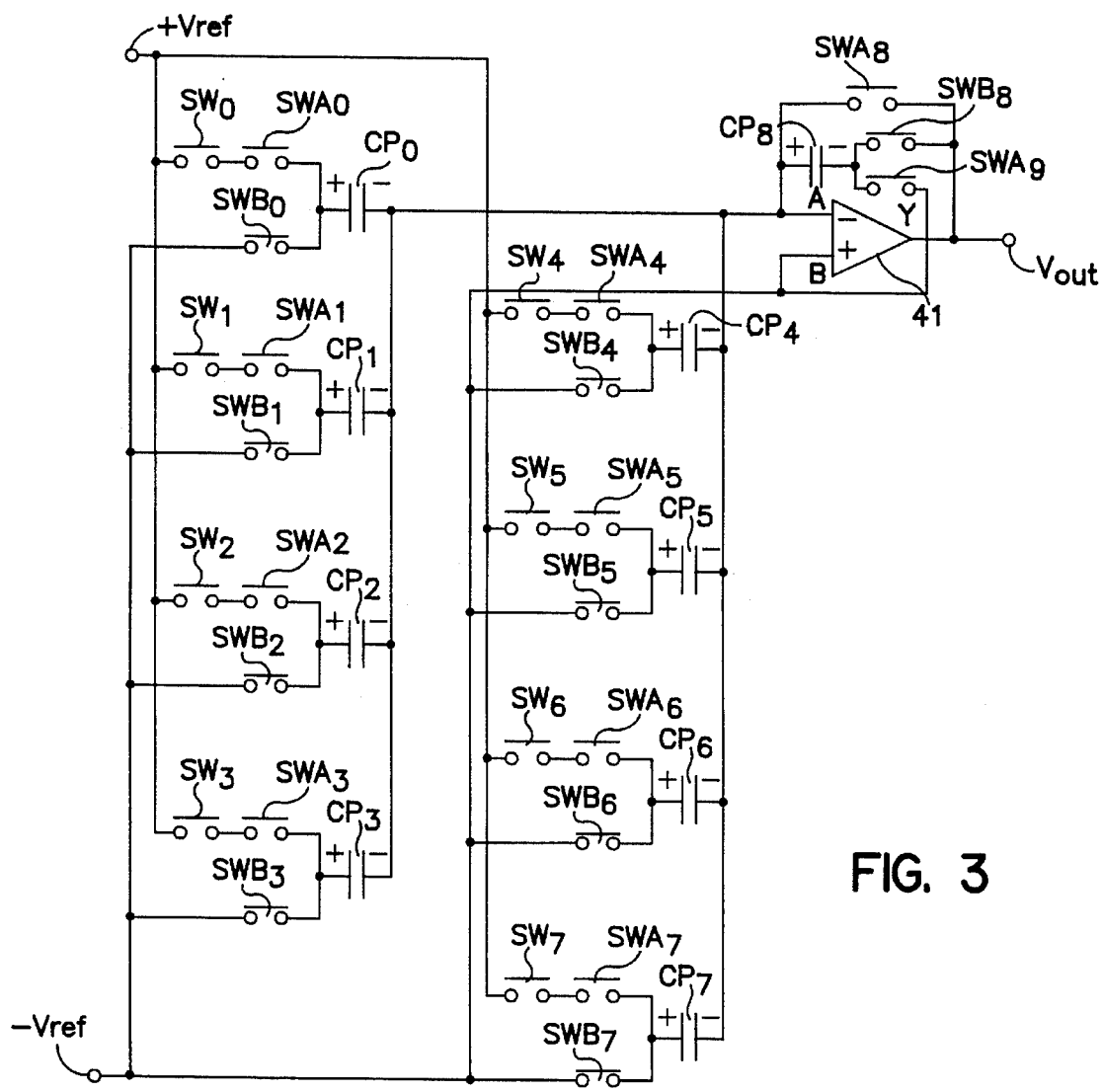
FIG. 3 is a structural diagram showing an output circuit in a second embodiment for composing the LCD control system of the invention.

The output circuit in FIG. 3 possesses eight capacitors $CP_0, CP_1, \ldots, CP_k, \ldots, CP_7$ connected in parallel, and the capacitances of the capacitors $CP_0, CP_1, \ldots, CP_7$ are respectively reference capacitances $C, 2 \times C, \ldots, 2^k \times C, \ldots, 128 \times C$.

The negative side electrodes of the capacitors $CP_0, CP_1, \ldots, CP_7$ are connected to the inverting input terminal A of the operational amplifier 41, and the positive side electrodes of capacitors $CP_0, CP_1, \ldots, CP_7$ are connected to a power supply $-V_{ref}$ for feeding a reference input voltage through discharging switches $SWB_0, SWB_1, \ldots, SWB_7$, respectively. Furthermore, one of the terminals of each one of charging switches $SWA_0, SWA_1, \ldots, SWA_7$ is connected to the positive side electrodes of the capacitors $CP_0, CP_1, \ldots, CP_7$. These charging switches $SWA_0, SWA_1, \ldots, SWA_7$ are set in ON state when sampling the input voltage.

At the other terminals of the charging switches $SWA_0, SWA_1, \ldots, SWA_7$, one of the terminals of each one of digital input switches $SW_0, SW_1, \ldots, SW_7$ is connected. The digital input switches $SW_0, SW_1, \ldots, SW_7$ correspond to the bits of the digital signal fed in the output circuit, and are set in ON state when the corresponding bit is 1, and set in OFF state when 0.

Furthermore, the other terminals of the digital input switches $SW_0, SW_1, \ldots, SW_7$ are connected to a power supply $+V_{ref}$ for supplying reference input voltage.

Switches are composed of the charging switches $SWA_0, SWA_1, \ldots, SWA_7$, discharging switches $SWB_0, SWB_1, \ldots, SWB_7$, and digital input switches $SW_0, SW_1, \ldots, SW_7$.

A charging switch $SWA_8$ is connected between the inverting input terminal A and output terminal of the operational amplifier 41. A charging switch $SWA_9$ is connected between the positive electrode of a negative feedback capacitor $CP_8$ and the reference input voltage (power supply) $-V_{ref}$, and it is set in ON state when sampling the input voltage of the operational amplifier 41. A discharging switch $SWB_8$ is connected between the positive electrode of the negative feedback capacitor $CP_8$ and the output $V_{out}$, and discharges the stored electric charge.

The output Y of the operational amplifier 41 is fed back to the inverting input terminal A of the operational amplifier 41 through the charging switch $SWA_8$, and is fed back to the inverting input terminal A through the discharging switch $SWB_8$ and negative feedback capacitor $CP_8$. The noninverting input terminal B of the operational amplifier 41 is connected to the reference input voltage (power supply) $-V_{ref}$, and is connected to the inverting input terminal A through the charging switch $SWA_9$ and negative feedback capacitor $CP_8$. The negative feedback capacitor $CP_8$ possesses a capacitance of $2_8 \times C$ (256C) of the reference capacitance. The output voltage generated by this output circuit is produced from the output terminal $V_{out}$.

The operation of thus composed output circuit of LCD control system is explained below. In the first place, the discharging switches $SWB_0, SWB_1, \ldots, SWB_8$ are set in ON state. As a result, the output Y of the operational amplifier 41 is negatively fed back to the inverting input terminal A of the operational amplifier 41 through the discharging switch $SWB_8$. By such negative feedback, the potential difference between the inverting input terminal A and the noninverting input terminal B becomes an offset voltage $V_{off}$ as shown in Formula (4).

$$V_{off} = \text{(potential of noninverting input terminal } B \text{ of operational} \quad (4)$$
$$\text{amplifier 41)} - \text{(potential of inverting input terminal}$$
$$A \text{ of operational amplifier 41)}$$

Besides, the potential difference between positive and negative electrodes of the capacitors $CP_0, CP_1, \ldots, CP_7$ becomes equal also to the offset voltage $V_{off}$. At this time, the electric charge $Q_{DCn}$ stored in each of the capacitors $CP_0, CP_1, \ldots, CP_7$ is $$Q_{DCn} = 2^n \times C \times V_{off} [n=0 \text{ to } 7] \quad (5)$$

Consequently, the eight-bit digital input signal is fed to the digital input switches $SW_0, SW_1, \ldots, SW_7$, and corresponding to the individual bits of the digital input signal, the digital input switches $SW_0, SW_1, \ldots, SW_7$ are set in ON state or OFF state. The most significant bit (MSB) of the digital input signal corresponds to the digital input switch $SW_7$, and the least significant bit (LSB) of the digital input signal corresponds to the digital input switch $SW_0$.

Then, after setting all of dischargeing switches $SWB_0, SWB_1, \ldots, SWB_8$ in OFF state, all of charging swiches $SWA_0, SWA_1, \ldots, SWA_9$ are set in ON state. At this time, of the digital input switches $SW_0, SW_1, \ldots, SW_7$, the electric charge $Q_{CCn}$ stored in the capacitors connected to the switches set in ON state is $$Q_{CCn} = 2^n \times C \times ((+V_{ref}) - (-V_{ref}) + V_{off}) [n=0 \text{ to } 7] \quad (6)$$

Besides, since the charging switch $SWA_9$ is set in ON state, the offset voltage $V_{off}$ is applied to the negative feedback capacitor $CP_8$ as shown in Formula (7).

$$V_{CP8} = V_{off} \quad (7)$$

Therefore, the electric charge $Q_{CP8}$ stored in the negative feedback capacitor $CP_8$ is as shown in Formula (8).

$$Q_{CP8} = 256 \times C \times V_{off} \quad (8)$$

Sequentially, after setting all of charging switches $SWA_0, SWA_1, \ldots, SWA_9$ in OFF state, the discharging switches $SWB_0, SWB_1, \ldots, SWB_8$ are all set in ON state. At this time, since the output Y of the operational amplifier 41 is negatively fed back to the inverting input terminal A through the discharging switch $SWB_8$, the potential difference between the inverting input terminal A and the noninverting input terminal B becomes equal to the offset voltage $V_{off}$ again.

Besides, the potential difference between the positive and negative electrodes of the capacitors $CP_0$, $CP_1$, ..., $CP_7$ becomes also equal to the offset voltage $V_{off}$. At this time, the electric charges moving from the negative electrodes of the capacitors $CP_0$, $CP_1$, ..., $CP_7$ are collected in the negative electrode of the negative feedback capacitor $CP_8$. The electric charge quantity $\Delta Q_{CP8}$ moving to the negative electrode of the negative feedback capacitor $CP_8$ is expressed as follows, supposing the numerical value of bit information 0 or 1 of digital input signal to be bit$n$.

$$\Delta Q_{CP8} = (1 \times bit0 + 2 \times bit1 + 4 \times bit2 + 8 \times bit3 + 16 \times bit4 + 32 \times bit5 + 64 \times bit6 + 128 \times bit7) \times C \times ((+V_{ref}) - (-V_{ref})) \quad (9)$$

For example, when a digital input signal of "10110010" in binary notation is supplied, bit0, bit2, bit3 and bit6 are 0 (OFF state), while bit1, bit4, bit5 and bit7 are 1 (ON state), and the electric charge quantity $\Delta Q_{CP8}$ moving to the negative electrode of the negative feedback capacitor $CP_8$ is determined from Formula (10).

$$\begin{aligned}\Delta Q_{CP8} &= (2 + 16 + 32 + 128) \times C \times ((+V_{ref}) - (-V_{ref})) \quad (10)\\ &= 178 \times C \times ((+V_{ref}) - (-V_{ref}))\end{aligned}$$

At this time, the electric charges opposite in the polarity to the moved electric charges and same in the quantity are collected at the positive electrode of the negative feedback capacitor $CP_8$. The potential of the negative electrode of the negative feedback capacitor $CP_8$ is at the same potential as the inverting input terminal A of the operational amplifier 41, and from Formula (4), we obtain $$(\textit{Potential at negative electrode of capacitor } CP_8) = (-V_{ref}) - V_{off} \quad (11)$$

Hence, if the electric charges are not moved by the capacitors $CP_0$, $CP_1$, ..., $CP_7$, the output $V_{out}$ of the output circuit is obtained as follows from Formulas (7) and (11)

$$V_{out} = (-V_{ref}) - V_{off} + V_{off} = -V_{ref} \quad (12)$$

and when the electric charges are moved as in Formula (9), the output $V_{out}$ is $$V_{out} = (1/256) \times (.bit0 + 2.bit1 + 4.bit2 + 8.bit3 + 16.bit4 + 32.bit5 + 64.bit6 + 128.bit7) \times ((+V_{ref}) - (-V_{ref})) + (-V_{ref}) \quad (13)$$

When the binary digital signal "10110010" shown in the example above is entered, the output is $$V_{out} = (178/256) \times ((+V_{ref}) - (-V_{ref})) + (-V_{ref}) \quad (14)$$

Thus, in the embodiment in FIG. 3, corresponding to each bit of eight-bit digital signal, capacitors $CP_0$, $CP_1$, ..., $CP_7$ having reference capacitances of $2^0$ to $2^7$ times, respectively, and switches for turning on or off the charging to the capacitors depending on the bit information of the input digital signal are provided, so that the electric charge corresponding to the numerical value expressed by the input digital signal are charged in the capacitors, and the output voltage proportional to the stored electric charge is obtained by the amplifier, thereby a required output voltage is obtained. That is, a necessary voltage may be generated without setting many reference voltages. Therefore, according to the LCD control system in which the output circuit shown in FIG. 3 is incorporated, the number of wirings may be reduced significantly.

As described herein, the LCD control system having the output circuit in the embodiment in FIG. 3 comprises n capacitors connected in parallel possessing different capacitances ranging from 2 to the power of 0 to 2 to the power of (n−1) of ($2^0$ to $2^{n-1}$ times as large as) the reference capacitance (n: a positive integral number), and each capacitor is provided with n switches for turning on or off the charge or discharge of electric charge, and therefore by turning on or off the n switches depending on the bit information of digital signal, the electric charge corresponding to the digital input signal is stored in the capacitors. When the voltage generated by the stored electric charge is supplied in the amplifier, the output voltage corresponding to the digital input signal is obtained. Thus, in the LCD control system having the output circuit in the embodiment in FIG. 3, a necessary voltage may be generated without having to set many reference voltages. Therefore, the number of wirings and number of circuits may be saved in the LCD control system.

Figure 4:
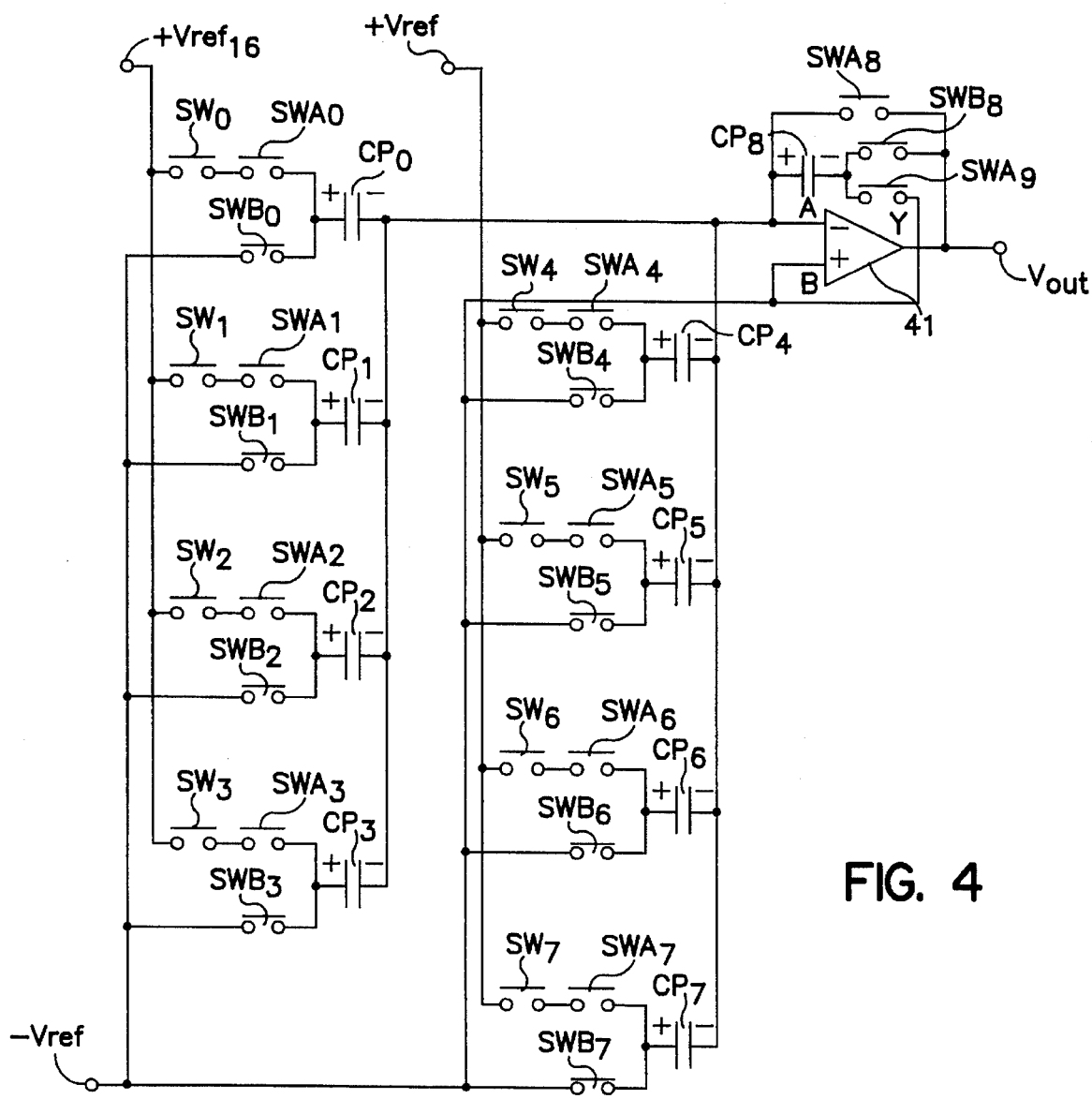
FIG. 4 is a structural diagram showing an output circuit in a third embodiment for composing the LCD control system of the invention.

Referring then to FIG. 4, a third embodiment of the output circuit comprising a DA converter for composing the LCD control system of the invention is described below.

In the output circuit in FIG. 4, two reference input voltages are supplied from a power supply $+V_{ref/16}$ and a power supply $+V_{ref}$, and the potential difference between the power supply $-V_{ref}$ and the power supply $+V_{ref/16}$ is $1/16$ of the potential difference between the power supply $-V_{ref}$ and the power supply $+V_{ref}$. The output circuit of the embodiment comprises eight capacitors $CP_0$, $CP_1$, ..., $CP_7$ connected in parallel, and a negative feedback capacitor $CP_8$. The capacitors $CP_0$, $CP_1$, ..., $CP_7$ consist of a set of four capacitors $CP_0$ to $CP_3$, and a set of another four capacitors $CP_4$ to $CP_7$. The capacitance of capacitors $CP_0$ and $CP_4$ is the reference capacitance C, the capacitance of capacitors $CP_1$ and $CP_5$ is $2 \times C$, the capacitance of capacitors $CP_2$ and $CP_6$ is $4 \times C$, the capacitance of capacitors $CP_3$ and $CP_7$ is $8 \times C$, and the capacitance of the negative feedback capacitor $CP_8$ is $16 \times C$. In the embodiment, meanwhile, the positive side electrodes of the capacitors $CP_0$ to $CP_3$ are connected to the reference input voltage (power supply) $+V_{ref/16}$ through charging switches $SWA_0$ to $SWA_3$ and digital input switches $SW_0$ to $SW_3$, and the positive side electrodes of the capacitors $CP_4$ to $CP_7$ are connected to the reference input voltage (power supply) $+V_{ref}$ through charging switches $SWA_4$ to $SWA_7$ and digital input switches $SW_4$ to $SW_7$. The composition of other parts is same as in the output circuit in the second embodiment shown in FIG. 3, and the corresponding parts are identified with the same reference numbers.

The operation of thus composed output circuit of the LCD control system is explained below. At the beginning, the discharging switches $SWB_0$, $SWB_1$, ..., $SWB_8$ are set in ON state. Hence, the output Y of the operational amplifier 41 is negatively fed back to the inverting input terminal A of the operational amplifier 41 through the discharging switch $SWB_8$ and the negative feedback capacitor $CP_8$. By such negative feedback, the potential difference between the inverting input terminal A and noninverting input terminal B becomes the offset voltage $V_{off}$ as shown in Formula (15).

$$V_{off} = (\text{potential of noninverting input terminal } B \text{ of operational amplifier 41}) - (\text{potential of inverting input terminal } A \text{ of operational amplifier 41}) \quad (15)$$

The potential difference between positive and negative electrodes of capacitors $CP_0$, $CP_1$, ..., $CP_7$ is also equal to the offset voltage. At this time, the electric charge quantity $Q_{DCn}$ charged in the capacitors $CP_0, CP_1, \ldots, CP_7$ is $$Q_{DCn}=2^n \times C \times V_{off} \quad [n=0 \text{ to } 3]$$

$$Q_{DCn}=2^{n-4} \times C \times V_{off} \quad [n=4 \text{ to } 7] \quad (16)$$

Consequently, an eight-bit digital input signal is fed in the digital input switches $SW_0, SW_1, \ldots, SW_7$, and corresponding to each bit of the digital signal, the digital input switches $SW_0, SW_1, \ldots, SW_7$ are set in ON state or OFF state. The most significant bit (MSB) of the digital input signal corresponds to the digital input switch $SW_7$, and the least significant bit (LSB) of the digital input signal corresponds to the digital input switch $SW_0$.

After setting all of discharging switches $SWB_0, SWB_1, \ldots, SWB_8$ in OFF state, all of charging switches $SWA_0, SWA_1, \ldots, SWA_9$ are set in ON state. At this time, the electric charge $Q_{ccn}$ charged in the capacitors connected to the switches set in ON state out of the digital input switches $SW_0, SW_1, \ldots, SW_7$ is as follows.

$$Q_{ccn}=2^n \times C \times (((+V_{ref})-(-V_{ref}))/16+V_{off}) \quad [n=0 \text{ to } 3]$$

$$Q_{ccn}=2^{n-4} \times C \times ((+V_{ref})-(-V_{ref})+V_{off}) \quad [n=4 \text{ to } 7] \quad (17)$$

Besides, since the charging switch $SWA_9$ is set in ON state, an offset voltage $V_{off}$ is applied to the capacitor $CP_8$ as shown in Formula (18).

$$V_{CP8}=V_{off} \quad (18)$$

Therefore, the electric charge $Q_{CP8}$ stored in the negative feedback capacitor $CP_8$ is as shown in Formula (19).

$$Q_{CP8}=16 \times C \times V_{off} \quad (19)$$

Next, after setting all of charging switches $SWA_0, SWA_1, \ldots, SWA_9$ in OFF state, all of discharging switches $SWB_0, SWB_1, \ldots, SWB_8$ are set in ON state. At this time, since the output Y of the operational amplifier 41 is negatively fed back to the inverting input terminal A through the discharging switch $SWB_8$ and the negative feedback capacitor $CP_8$, the potential difference between the inverting input terminal A and the noninverting input terminal B becomes equal to the offset voltage $V_{off}$ again. At the same time, the potential difference between the positive and negative electrodes of the capacitors $CP_0, CP_1, \ldots, CP_7$ becomes also equal to the offset voltage $V_{off}$. At this time, the electric charges moving from the negative electrodes of the capacitors $CP_0, CP_1, \ldots, CP_7$ are collected at the negative electrode of the negative feedback capacitor $CP_8$. The electric charge quantity $\Delta Q_{CP8}$ moving to the negative electrode of the negative feedback capacitor $CP_8$ is as follows, expressing the numerical value of the bit information 0 or 1 of digital input signal as bitn.

$$\Delta Q_{CP8} = (1/16) \times (1 \cdot bit0 + 2 \cdot bit1 + 4 \cdot bit2 + 8 \cdot bit3) \times \quad (20)$$
$$C \times ((+V_{ref}) - (-V_{ref})) + (1 \cdot bit4 + 2 \cdot bit5 + 4 \cdot bit6 + 8 \cdot bit7) \times C \times ((+V_{ref}) - (-V_{ref}))$$
$$= (((1 \cdot bit0 + 2 \cdot bit1 + 4 \cdot bit2 + 8 \cdot bit3)/16) + (1 \cdot bit4 + 2 \cdot bit5 + 4 \cdot bit6 + 8 \cdot bit7)) \times C \times (+V_{ref}) - (-V_{ref}))$$

For example, when a digital input signal of "10110010" in binary notation is supplied, bit0, bit2, bit3 and bit6 are 0 (OFF state), and bit1, bit4, bit5 and bit7 are 1 (ON state), and the electric charge quantity $\Delta Q_{CP8}$ moving to the negative electrode of the negative feedback capacitor $CP_8$ at this time is obtained from Formula (21).

$$\Delta Q_{CP8} = (2/16 + 1 + 2 + 8) \times C \times ((+V_{ref}) - (-V_{ref})) \quad (21)$$
$$= (178/16) \times C \times ((+V_{ref}) - (-V_{ref}))$$

At this time, the electric charges of the same quantity of the charges being moved and opposite in polarity are collected at the positive electrode of the negative feedback capacitor $CP_8$. The potential of the negative electrode of the negative feedback capacitor $CP_8$ is same as the potential at the inverting input terminal A of the operational amplifier 41, and from Formula (15) it is known as follows.

(Potential at negative electrode of capacitor $CP_8$) $= (-V_{ref})-V_{off}$ (22)

Hence, if the electric charges are not moved by the capacitors $CP_0, CP_1, \ldots, CP_7$, the output $V_{out}$ of the output circuit is calculated from Formulas (18) and (22) as follows $$V_{out}=(-V_{ref})-V_{off}+V_{off}=-V_{ref} \quad (23)$$

and when the electric charges are moved as shown in Formula (20), it follows that $$V_{out} = (1/16) \times ((1 \cdot bit0 + 2 \cdot bit1 + 4 \cdot bit2 + 8 \cdot bit3)/16 + \quad (24)$$
$$1 \cdot bit4 + 2 \cdot bit5 + 4 \cdot bit6 + 8 \cdot bit7) \times ((+V_{ref}) -$$
$$(-V_{ref})) + (-V_{ref})$$

When the binary digital signal "10110010" in the example above is entered, the output is $$V_{out}=(178/256) \times ((+V_{ref})-(-V_{ref}))+(-V_{ref}) \quad (25)$$

Thus, according to the embodiment in FIG. 4, capacitors consist of two sets of capacitors comprising four capacitors, of which capacitance ranges from $2^0$ to $2^3$ of the specified reference capacitance, and the two sets are supplied with voltages of $2^0$ and $2^{-4}$ (1/16) of the reference voltage $+V_{ref}$, and therefore by turning on or off the eight switches provided in the capacitors $CP_0, CP_1, \ldots, CP_7$ corresponding to the bit information of eight-bit digital signal, the electric charge corresponding to the numerical value expressed by the input digital signal is stored in the capacitors. The voltage proportional to the stored electric charge is generated by the operational amplifier 41, and an output voltage corresponding to the input digital signal is obtained. Besides, by the constitution of the embodiment, the total capacitance value of the capacitors for composing the output circuit may be reduced to about 1/11 of that of the output circuit in the second embodiment.

As explained herein, the LCD control system posessing the output circuit in FIG. 4 comprises n capacitors consisting of m sets possessing different capacitance ranging from 2 to the power of 0 to 2 to the power of (n−1) of ($2^0$ to $2^{n-1}$ times as large as) the specified reference capacitance value (n: a positive integral number), and power supply group for supplying voltages ranging from 2 to the power of (−n)×0 to 2 to the power of (−n)×(m−1) of [$2^{(-n) \times 0}$ to $2^{(-n)(m-1)}$ times as large as] the specified reference voltage to m sets (n, m: positive integral numbers), and therefore by turning on or off the n×m switches disposed in the capacitors on the basis of the bit information of the digital signal, the electric charge corresponding to the digital input signal is stored in the capacitors. The voltage proportional to the stored electric charge is generated by the amplifier, and an output voltage corresponding to the digital input signal is obtained without having to set many reference voltages. Therefore, according to the embodiment, the number of wirings and number of circuits may be reduced in the LCD control system.

A fourth embodiment of an output circuit comprising a DA converter for composing the LCD control system of the invention is described below by reference to FIG. 5.

Figure 5:
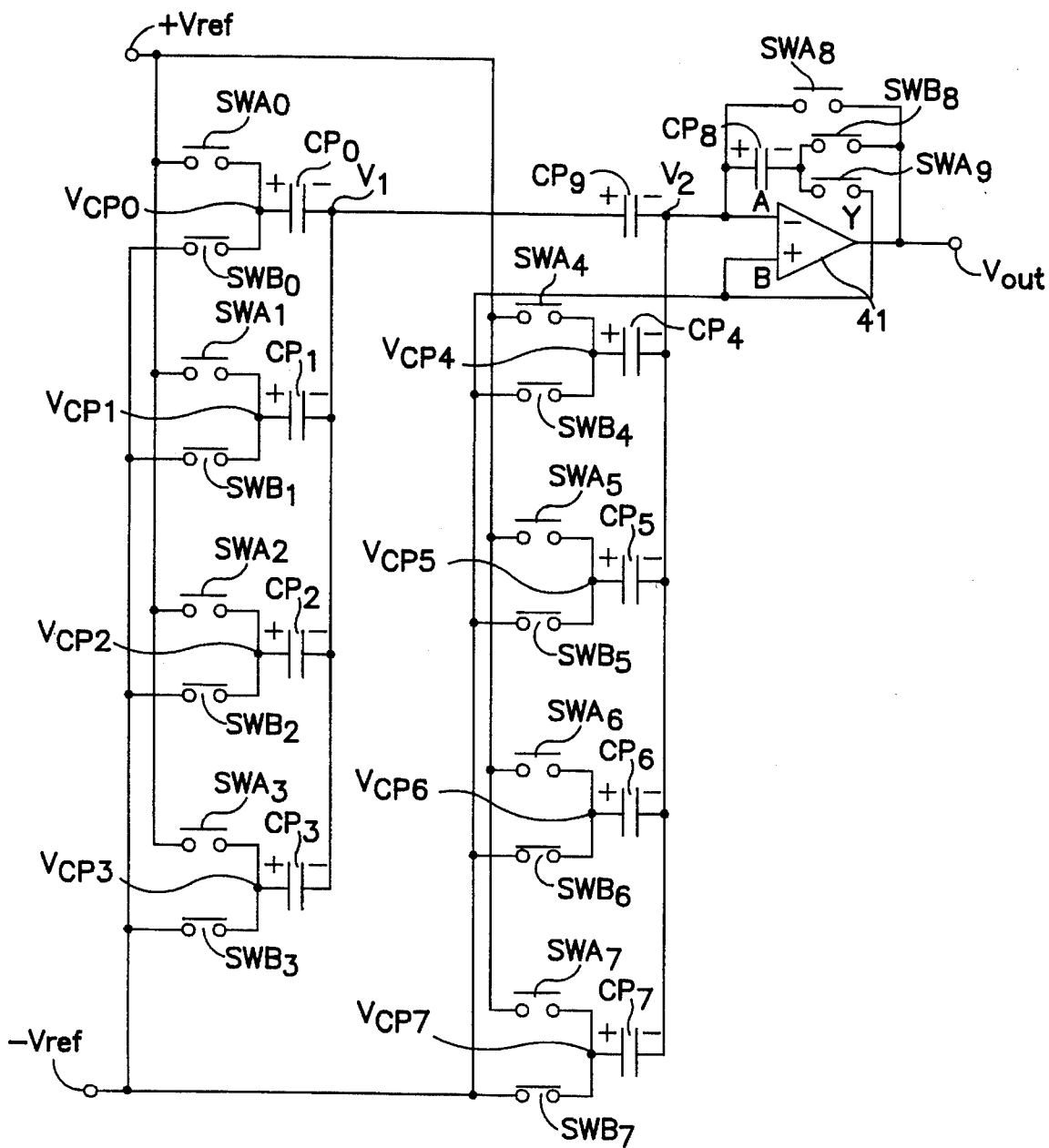
FIG. 5 is a structural diagram showing an output circuit in a fourth embodiment for composing the LCD control system of the invention.

The output circuit in FIG. 5 possesses eight capacitors $CP_0$, $CP_1$, ..., $CP_7$ connected in parallel, a negative feedback capacitor $CP_8$, and a dividing capacitor $CP_9$. The capacitors $CP_0$, $CP_1$, ..., $CP_7$ consist of one set composed of four capacitors $CP_0$ to $CP_3$, and the other set composed of four capacitors $CP_4$ to $CP_7$. These capacitors $CP_0$, $CP_1$, ..., $CP_7$ correspond to each bit of the eight-bit digital signal, and in the embodiment in FIG. 5, the capacitors $CP_0$ to $CP_3$ correspond to the lower four bits, and the capacitors $CP_4$ to $CP_7$, to the upper four bits.

The dividing capacitor $CP_9$ is connected in series to one set of capacitors $CP_0$ to $CP_3$, and divides the voltage generated by the capacitors $CP_0$ to $CP_3$ corresponding to the lower four bits. The dividing capacitor $CP_9$ is connected parallel to the other set of capacitors $CP_4$ to $CP_7$.

The capacitance of capacitors $CP_0$ and $CP_4$ is the reference capacitance C, the capacitance of capacitors $CP_1$ and $CP_5$ is 2×C, the capacicance of capacitors $CP_2$ and $CP_6$ is 4×C, the capacitance of capacitors $CP_3$ and $CP_7$ is 8×C, the capacitance of the negative feedback capacitor $CP_8$ is 16×C, and the capacitance of the dividing capacitor $CP_9$ is the reference capacitance C.

The negative side electrodes of the capacitors $CP_0$ to $CP_3$ corresponding to the lower four bits are connected to the positive side electrode of the dividing capacitor $CP_9$, and the negative side electrode of the dividing capacitor $CP_9$ and the capacitors $CP_4$ to $CP_7$ corresponding to the upper four bits are connected to the inverting input terminal A of the operational amplifier 41.

The positive side electrodes of the capacitors $CP_0$, $CP_1$, ..., $CP_7$ are connected to the power supply $-V_{ref}$ for supplying reference input voltage through discharging switches $SWB_0$, $SWB_1$, ..., $SWB_7$ turned on or off depending on the bit data of the digital signal, and are likewise connected to the power supply $+V_{ref}$ for supplying reference input voltage through charging switches $SWA_0$, $SWA_1$, ..., $SWA_7$ turned on or off depending on the bit data of the digital signal.

A sampling circuit is composed of the capacitors $CP_0$, $CP_1$, ..., $CP_7$, charging switches $SWA_0$, $SWA_1$, ..., $SWA_7$, and discharging switches $SWB_0$, $SWB_1$, ..., $SWB_7$, while a DA converter is composed of the operational amplifier 41 and negative feedback capacitor $CP_8$.

The charging switches $SWA_0$, $SWA_1$, ..., $SWA_7$ are set in ON state when sampling the input voltage. Switches are composed of the charging switches $SWA_0$, $SWA_1$, ..., $SWA_7$ and discharging switches $SWB_0$, $SWB_1$, ..., $SWB_7$.

The other constitution is same as in the output circuit shown in FIG. 4, and the corresponding parts are identified with the same reference numbers. For the sake of simplicity of explanation, as shown in FIG. 5, the potential at the negative side electrodes of the capacitors $CP_0$ to $CP_3$ is supposed to be $V_1$, and the potential at the negative side electrodes of the dividing capacitor $CP_9$ and the capacitors $CP_4$ to $CP_7$, to be $V_2$.

The operation of thus composed output circuit of the LCD control system is described below.

The operational amplifier 41 functions so that the inverting and noninverting input terminals A, B may be always at identical potential, and therefore in the stationary state the inverting and noninverting input terminals A, B are at the reference input voltage $-V_{ref}$. Therefore, the reference input voltage $-V_{ref}$ is applied also to the negative electrodes of the capacitors $CP_4$ to $CP_7$ corresponding to the upper four bits.

On the other hand, the reference input voltage $-V_{ref}$ appearing at the inverting input terminal A of the operational amplifier 41 is divided by the parallel capacitance of the capacitors $CP_0$ to $CP_3$ corresponding to the lower four bits, and the dividing capacitor $CP_9$, and the potential $V_1$ is applied to the negative electrodes of the capacitors $CP_0$ to $CP_3$ corresponding to the lower four bits.

In this state, depending on the specified input digital signal, for example, the charging switches $SWA_0$, $SWA_1$, ..., $SWA_7$ are set in ON state, and at the same time the charging switches $SWA_8$, $SWA_9$ are set in ON state, and all of discharging switches $SWB_0$, $SWB_1$, ..., $SWB_8$ are set in OFF state. At this time, a potential of $-V_{ref}$ is applied to both ends of the negative feedback capacitor $CP_8$.

On the other hand, the reference input voltage $+V_{ref}$ is applied to the positive electrodes of the capacitors $CP_4$ to $CP_7$ corresponding to the upper four bits through the charging switches $SWA_4$, ..., $SWA_7$. As a result, the capacitors $CP_4$ to $CP_7$ are charged. This is the state of sampling depending on the input digital signal.

Next, when the charging switches $SWA_0$, $SWA_1$, ..., $SWA_9$ are set in OFF state, and the discharging switch $SWB_4$, ..., $SWB_8$ are set in ON state, the electric charges stored in the capacitors $CP_4$ to $CP_7$ are moved to the negative feedback capacitor $CP_8$. The voltage generated as a result of this movement of electric charges is delivered as the output $V_{out}$ through the discharging switch $SWB_8$. In consequence, the voltage of the output $V_{out}$ being so far the reference input voltage $-V_{ref}$ changes to the voltage corresponding to the electric charges stored in the negative feedback capacitor $CP_8$. This voltage depends on the input digital signal, and thereby digital-to-analog conversion has been substantially effected.

Shown above is a case of simultaneous charging of the capacitors $CP_4$ to $CP_7$ corresponding to the upper four bits, but it is the same when other digital signal is fed. For example, when a digital signal to charge any one of the capacitors $CP_0$ to $CP_3$ corresponding to the lower four bits is fed, instead of the reference input voltage $-V_{ref}$, charging is effected on the basis of the divided potential $V_1$, and the fundamental sampling and amplifying actions are quite the same.

Thus, in the output circuit comprising a digital-to-analog converter in FIG. 5, the resolution of 1/16 is realized by the capacitors $CP_4$ to $CP_7$ corresponding to the upper four bits, and the resolution of 1/256 is realized by the capacitors $CP_0$ to $CP_3$ corresponding to the lower four bits.

The digital-to-analog conversion action of the digital-to-analog converter in FIG. 5 is explained practically below by using numerical expressions.

In the first place, the electric charge at the negative side electrodes of the capacitors $CP_0$, $CP_1$, $CP_2$, $CP_3$ corresponding to the lower four bits and the dividing capacitor $CP_9$ is numerically expressed, by supposing that a charge K (coulomb) is present, as being not neutralized. Here, assuming the potential of the positive side electrode of the capacitor $CP_n$ to be $V_{CPn}$, it follows that $$K = C \times (V_{CP0} - V_1) + 2 \times C \times (V_{CP1} - V_1) + 4 \times C \times \qquad (26)$$

$$(V_{CP2} - V_1) + 8 \times C \times (V_{CP3} - V_1) + C \times (V_2 - V_1)$$
$$K/C = V_{CP0} + 2 \times V_{CP1} + 4 \times V_{CP2} +$$

-continued $$8 \times V_{CP3} - 16 \times V_1 + V_2$$

After first setting the discharge switches $SWB_0$, $SWB_1$, ..., $SWB_8$ in OFF state, the charging switches $SWA_0$, $SWA_1$, ..., $SWA_9$ are set in ON state. As a result, $V_{CP0}$ to $V_{CP7}$ become $+V_{ref}$. At this time, the charging switch $SWA_8$ is in ON state, and the output Y (output $V_{out}$) of the operational amplifier 41 is negatively fed back to the inverting input terminal A of the operational amplifier 41 throught the charging switch $SWA_8$, and therefore the potential $V_2$ becomes as follows, with respect to the offset voltage $V_{off}$ generated between the noninverting input terminal B and inverting input terminal A of the operational amplifier 41.

$$V_2 = (-V_{ref}) - V_{off} \tag{27}$$

On the other hand, the divided potential $V_1$ at the negative side electrode of the capacitors $CP_0$ to $CP_3$ becomes as follows from Formulas (26) and (27):

$$K/C = (+V_{ref}) + 2 \times (+V_{ref}) + 4 \times (+V_{ref}) + 8 \times (+V_{ref}) - \tag{28}$$

$$16 \times V_1 + (-V_{ref}) - V_{off}$$

$$V_1 = (15 \times (+V_{ref}) + (-V_{ref}) - V_{off} - K/C)/16$$

At this time, since the changing switch $SWA_9$ is set in ON state, the positive side electrode of the negative feedback capacitor $CP_8$ is connected to the reference input potential (power supply) $-V_{ref}$, and an offset voltage $V_{off}$ is applied to the negative feedback capacitor $CP_8$ as shown in Formula (29). Therefore, the voltage $V_{CP8}$ at both ends of the negative feedback capacitor $CP_8$ is $$V_{CP8} = V_{off} \tag{29}$$

Then, after setting the charging switches $SWA_8$ and $SWA_9$ in OFF state, the discharging switch $SWB_8$ is set in ON state, and the ON or OFF state is set for the charging switches $SWA_0$, $SWA_1$, ..., $SWA_7$ and discharging switches $SWB_0$, $SWB_1$, ..., $SWB_7$ corresponding to the bits on the basis of the bit information of the input eight-bit digital signal. The most significant bit (MSB) of the digital input corresponds to the charging switch $SWA_7$ and discharging switch $SWB_7$, and the least significant bit (LSB) corresponds to the charging switch $SWA_0$ and discharging switch $SWB_0$.

For example, when bit n is 1, the charging switch $SWA_n$ is set in OFF state, and the discharging switch $SWB_n$ is set in ON state. When bit n is 0, the charging switch $SWA_n$ is set in ON state and the discharging switch $SWB_n$ is set in OFF state. At this time, the potential $V_1$ is obtained as follows, supposing each bit of the eight-bit digital input signal to be bit0 (LSB) to bit7 (MSB), and its inverted data to be Nbit0 (LSB) to Nbit7 (MSB):

$$K/C = ((+V_{ref}) \times Nbit0 + (-V_{ref}) \times bit0) + 2 \times ((+V_{ref}) \times \tag{30}$$

$$Nbit1 + (-V_{ref}) \times bit1) + 4 \times ((+V_{ref}) \times Nbit2 + (-V_{ref}) \times$$

$$bit2) + 8 \times ((+V_{ref}) \times Nbit3 + (-V_{ref}) \times bit3) - 16 \times$$

$$V_1 + (-V_{ref}) - V_{off}$$

$$K/C = (+V_{ref}) \times (Nbit0 + 2 \times Nbit1 + 4 \times Nbit2 + 8 \times$$

$$Nbit3) + (-V_{ref}) \times (bit0 + 2 \times bit1 + 4 \times bit2 + 8 \times$$

$$bit3) - 16 \times V_1 + (-V_{ref}) - V_{off}$$

$$V1 = ((+V_{ref}) \times (Nbit0 + 2 \times Nbit1 + 4 \times Nbit2 + 8 \times$$

$$Nbit3) + (-V_{ref}) \times (bit0 + 2 \times bit1 + 4 \times bit2 + 8 \times$$

$$bit3) + (-V_{ref}) - V_{off} - K/C)/16$$

Since the operational amplifier 41 is negatively fed back, a potential difference corresponding to the offset voltage shown in Formula (31) is generated between the inverting input terminal A and noninverting input terminal B.

$$V_{off} = \text{(potential of noninverting input terminal } B \text{ of operational} \tag{31}$$

$$\text{amplifier 41)} - \text{(potential of inverting input terminal } A$$

$$\text{of operational amplifier 41)}$$

Therefore, the potential $V_2$ is, same as in Formula (27):

$$V_2 = (-V_{ref}) - V_{off} \tag{32}$$

Accordingly, when the voltage applied to the voltages $V_{CP0}$ to $V_{CP7}$ applied to the positive side electrode of the capacitors $CP_0$, $CP_1$, ..., $CP_7$ is changed from $+V_{ref}$ to $-V_{ref}$, the electric charge at the negative side electrodes of the dividing capacitor $CP_9$ and the capacitors $CP_4$, $CP_5$, $CP_6$, $CP_7$ corresponding to the upper four bits are moved to the negative side electrode of the negative feedback capacitor $CP_8$. The electric charge quantity $\Delta Q_{CPn}$ moving from these capacitors $CP_4$ to $CP_7$ is $$\Delta Q_{CPn} = 2^{n-4} \times C \times ((+V_{ref}) - (-V_{ref})) \times bitn (n=4 \text{ to } 7) \tag{33}$$

Formula (33) is to express the upper four bits.

The electric charge quantity $\Delta Q_{CP9}$ moving from the dividing capacitor $CP_9$ is $$\Delta Q_{CP9} = -(C/16) \times ((-V_{ref}) \times (1 \cdot bit0 + 2 \cdot bit1 + 4 \cdot \tag{34}$$

$$bit2 + 8 \cdot bit3) + (+V_{ref}) \times (1 \cdot Nbit0 + 2 \cdot Nbit1 + 4 \cdot$$

$$Nbit2 + 8 \cdot Nbit3 - 15)).$$

Formula (34) is to express the lower four bits.

Supposing all bits of the digital input signal to be 0, the electric charge quantity $\Delta Q_{CP8}$ moving to the negative feedback capacitor $CP_8$ is known as follows from Formulas (33) and (34):

$$\Delta Q_{CP8} = 0 \tag{35}$$

Therefore, from Formulae (29) and (32), the output $V_{out}$ from the operational amplifier 41 is $$V_{out} = -V_{ref} \tag{36}$$

For example, when a digital input signal of "10110010" in binary notation is supplied, bit0, Nbit1, bit2, bit3, Nbit4, Nbit5, bit6 and Nbit7 are 0, and Nbit0, bit1, Nbit2, Nbit3, bit4, bit5, Nbit6 and bit7 are 1, and the output $V_{out}$ from the operational amplifier 41 is, from Formulas (33) and (34), as follows:

$$V_{out} = -((-V_{ref}) \times (0 + 2 \times 1 + 4 \times 0 + 8 \times 0) + \qquad (37)$$
$$(+V_{ref}) \times (1 + 2 \times 0 + 4 \times 1 + 8 \times 1 - 15))/256 +$$
$$(((+V_{ref}) - (-V_{ref})) \times 1 + 2 \times ((+V_{ref}) - (-V_{ref})) \times$$
$$1 + 4 \times ((+ \times V_{ref}) - (-v_{ref})) \times 0 + 8 \times ((+V_{ref}) -$$
$$(-V_{ref})) \times 1)/16 + (-V_{ref})$$
$$= ((+V_{ref}) - (-V_{ref}) \times {}^{178}/256 + (-V_{ref})$$

In this way, the voltage corresponding to the input digital signal is obtained in the output $V_{out}$, and digital-to-analog conversion is effected.

Thus, according to the embodiment in FIG. 5, comprising one dividing capacitor $CP_9$ connected in series to a set of capacitors $CP_0$ to $CP_3$ corresponding to the lower four bits of the digital signal, and connected in parallel to a set of capacitors $CP_4$ to $CP_7$ corresponding to the upper four bits, the electric charge stored in the set of capacitors $CP_0$ to $CP_3$ corresponding to the lower four bits is distributed in the dividing capacitor $CP_9$, and the voltage proportional to the stored electric charge in the dividing capacitor $CP_9$ and the set of capacitors $CP_4$ to $CP_7$ corresponding to the upper four bits is generated by the operational amplifier 41. Meanwhile, the number of switches and the capacitance in the embodiment are reduced same as in the output in the third embodiment shown in FIG. 4, while the reference power supply does not require the power supply of $+V_{ref/16}$ as used in the fourth embodiment, and it is possible to operate with two reference voltages.

As described herein, the LCD control system having the output circuit of the embodiment in FIG. 5 comprises (m−1) dividing capacitors connected in series to the capacitors in each set excluding the set corresponding to the most significant n bits of digital signal, and connected in series of the capacitors of the set corresponding to the next significant n bits, and therefore the electric charge stored in the capacitors in the set excluding the set corresponding to the most significant n bits is distributed in the electric charge of the dividing capacitor. The voltage proportional to the stored electric charges in the dividing capacitors and the capacitors of the set corresponding to the most significant n bits is generated by the operational amplifier, and an output voltage corresponding to the digital input signal may be obtained without having to set many reference voltages as in the prior art. Therefore, according to the embodiment, the number of wirings and the number of circuits in the LCD control system may be reduced.

A fifth embodiment of an output circuit comprising a DA converter for composing the LCD control system of the invention is described below while referring to FIG. 6.

In order to inspect the capacitors of the capacitive type DA converters shown in FIG. 2 through FIG. 5, the inspection precision of 2 to the nth power (n: a positive integral number) is needed depending on the increase of the number of bits. Accordingly, if the number of bits is particularly large in digital signal, an inspection apparatus of an extremely high inspection precision is required.

Figure 6:
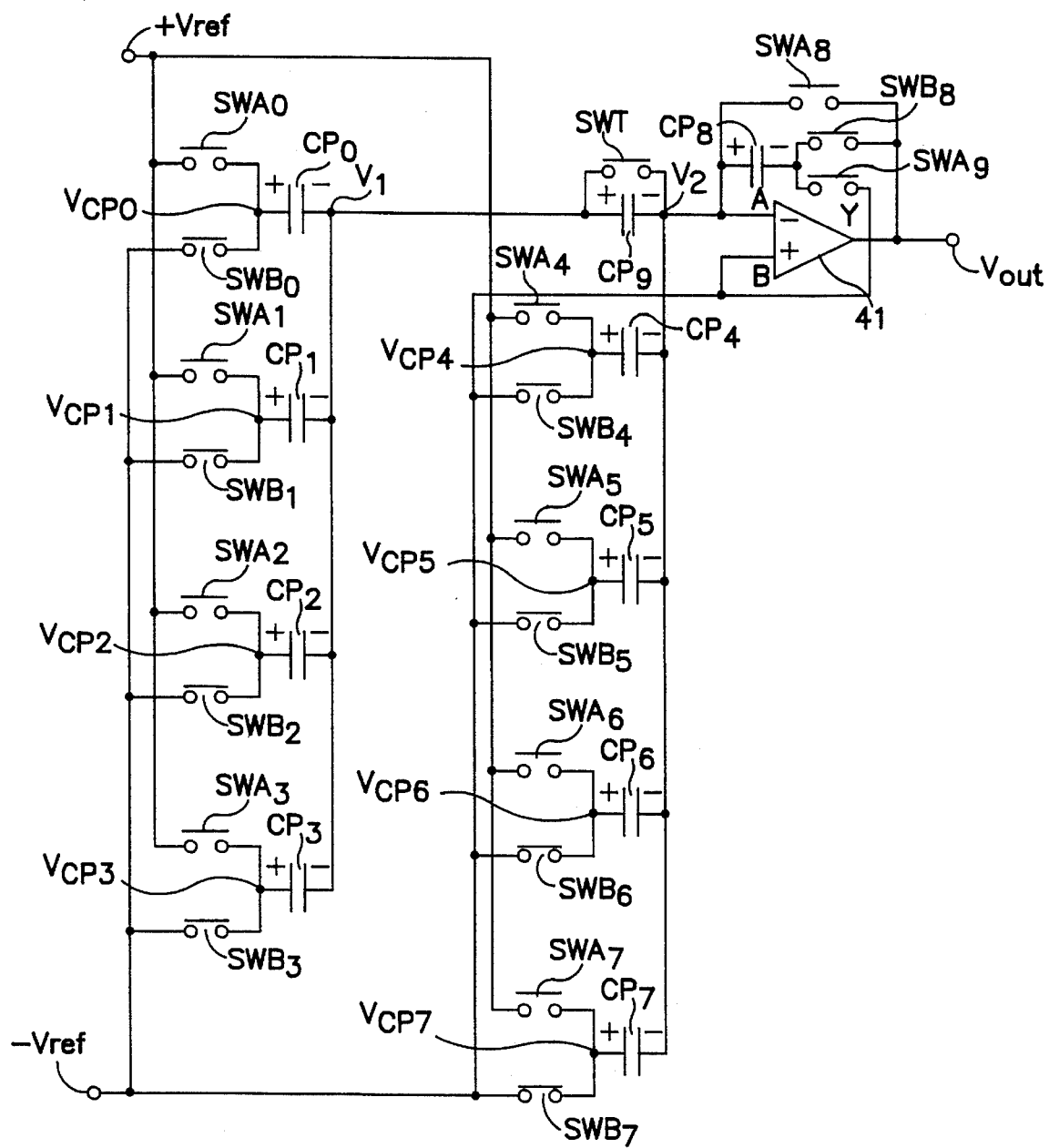
FIG. 6 is a structural diagram showing an output circuit in a fifth embodiment for composing the LCD control system of the invention.

The output circuit in FIG. 6 is intended to solve such problem, and is to present an LCD control system capable of inspecting capacitors corresponding to all bits of input digital signal by using an inspection apparatus of a relatively low inspection precision.

In FIG. 6, a test switch SWT is connected between both ends of a dividing capacitor $CP_9$. The other constitution is same as in the output circuit in the fourth embodiment shown in FIG. 5, and the corresponding parts are identified with the same reference numbers.

In thus composed LCD control system, its operation is described below.

At the time of digital-to-analog conversion, the test switch SWT is set in OFF state, and the operation of digital-to-analog conversion is same as in the output circuit in the fourth embodiment shown in FIG. 5, and its explanation is omitted.

The inspection of the LCD control system is explained.

Inspection is effected, with the tester (not shown) connected to the output $V_{out}$, by measuring the output $V_{out}$ by turning on or off the charging switches $SWA_0$, $SWA_1$, ..., $SWA_7$, and discharging switches $SWB_0$, $SWB_1$, ..., $SWB_8$.

The LCD control system in FIG. 6 is intended to convert the eight-bit digital signal into an analog signal, and it is therefore necessary to measure the output voltage, at a precision of 1/256 of the reference input voltage, depending on the ON or OFF state of the charging switches $SWA_0$, $SWA_1$, ..., $SWA_7$, and discharging switches $SWB_0$, $SWB_1$, ..., $SWB_8$. That is, as for the capacitors $CP_4$ to $CP_7$ corresponding to the upper four bits, it is enough to measure the changes of the output voltage at a precision of 1/16 of the reference input voltage. For example, when the reference input voltage is 5 (V), the precision of 5/16 (V), that about 300 mV is needed. As for the capacitors $CP_0$ to $CP_3$ corresponding to the lower four bits, a precision of its further 1/16 is needed.

Some of the analog testers have a precision of about 10 mV, and with such analog testers, the DA converters shown in FIGS. 2 to 5 may be sufficiently inspected. Generally, however, analog testers have only several terminals, and they are not suited to inspection of DA converters having more than 100 terminals. Yet, analog testers are very expensive.

On the other hand, digital testers generally have about 200 terminals, and are hence suited to inspection of DA converters. However, the precision of digital testers is about 50 mV, at best.

Therefore, the capacitors $CP_4$ to $CP_7$ of upper four bits requiring precision of only about 300 mV may be sufficiently measured by the digital testers with a precision of about 50 mV, but the capacitors $CP_0$ to $CP_3$ of lower four bits requiring a precision of its 1/16 cannot be measured by the digital testers having a precision of only 50 mV.

In the embodiment, accordingly, when testing the capacitors $CP_0$ to $CP_3$ of lower four bits, the test switch SWT is set in ON state, and the both ends of the dividing capacitor $CP_9$ are short-circuited.

In this way, the connective relationship of the capacitors $CP_0$ to $CP_3$ of the lower four bits to the operational amplifier 41 is same as the connective relationship of the capacitors $CP_4$ to $CP_7$ of the upper four bits to the operational amplifier 41. Therefore, the change of output $V_{out}$ due to capacitors $CP_0$ to $CP_3$ of lower four bits is about 300 mV, same as the change of output $V_{out}$ due to capacitors $CP_4$ to $CP_7$ of upper four bits. As a result, it is enough to measure with a digital tester having a precision of about 50 mV.

Thus, in the embodiment shown in FIG. 6, a samping circuit is composed of plural first capacitors corresponding to each lower bit of the input digital signal, plural second capacitors corresponding to each upper bit of input digital signal, plural switches turned on or off depending on the input digital signal and controlling charging and discharging of the capacitors of the first and second capacitors, and a dividing capacitor connected between the common node of the first capacitors and the common node of the second capacitors, and the voltage corresponding to the electric charge quantity appearing in the common node of the second capacitors is amplified by the amplifier and delivered as analog signal, and a switch is connected parallel to the dividing capacitor.

In this constitution, as for the first capacitors corresponding to the lower bits, too, the connective relationship may be set same as in the second capacitors corresponding to the upper bits by turning on the switch connected parallel to the dividing capacitor and short-circuiting the both ends of the dividing capacitor. Accordingly, it is possible to inspect at the same precision as in the second capacitors corresponding to the upper bits. Therefore, the capacitors corresponding to all bits can be inspected by using an inspection apparatus of a relatively low inspection precision.

Shown below are sixth and seventh embodiments of the output circuit comprising a DA converter for composing the LCD control system of the invention.

In the constitution of the capacitive type DA converter above, the operating point of the operational amplifier is either at the potential $(+V_{ref})$ or at the potential $(-V_{ref})$, and is biased to the periphery of the dynamic range of the operational amplifier. It is hence susceptible to fluctuations of supply voltage, and the supply voltage characteristics are poor.

The six and seventh embodiments of the invention are intended to present the LCD control system capable of solving such problems.

In the sixth embodiment, the mutually different first and second potentials are selectively applied to one end of the capacitor according to the input digital data, and the other end of the capacitor is connected to the inverting input terminal of the operational amplifier. At the same time, a potential nearly in the middle of the first and second potentials is applied to the noninverting input terminal of the operational amplifier, and the same potential as the first or second potential selectively applied to the other end of the feedback capacitor of which one end is connected to the inverting input terminal of the operational amplifier.

In the LCD control system of the seventh embodiment, the mutually different first and second potentials, and a third potential nearly in the middle of the first and second potentials are selectively applied to one end of the capacitor according to the input digital data, and the other end of the capacitor is connected to the inverting input terminal of the operational amplifier, and a same potential as the third potential is applied to the noninverting input terminal of the operational amplifier, and a feedback capacitor is connected between the inverting input terminal and output terminal of the operational amplifier.

In this consitution, the operating point of the operational amplifier may be set at a middle voltage of the first and second potentials, and the operational amplifier may be operated nearly in the middle of its dynamic range. As a result, the LCD control system resistant to fluctuations of supply voltage and excellent in supply voltage characteristics may be obtained.

Figure 7:
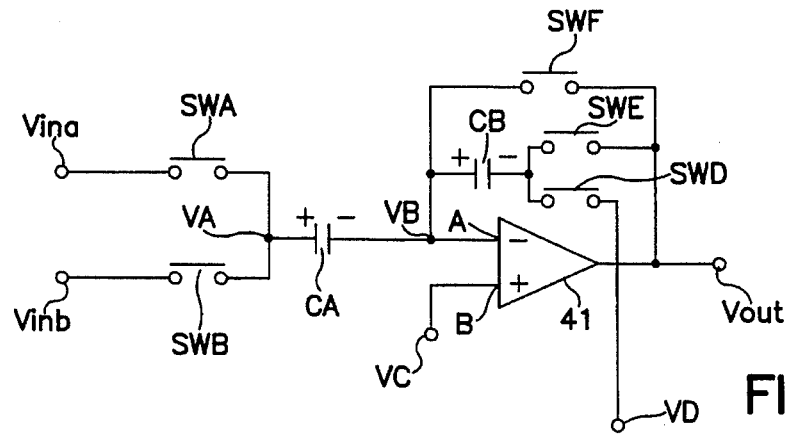
FIG. 7 is a structural diagram showing an output circuit in a sixth embodiment for composing the LCD control system of the invention.
Figure 8:
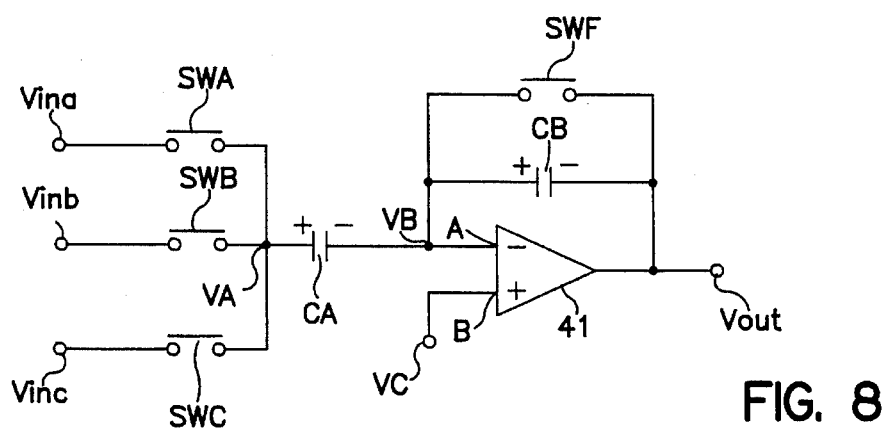
FIG. 8 is a structural diagram showing an output circuit in a seventh embodiment for composing the LCD control system of the invention.

Referring now to FIG. 7 and FIG. 8 the sixth and seventh embodiments of the output circuit comprising a DA converter for composing the LCD control system of the invention are described in detail below.

FIG. 7 is a structural diagram showing the output circuit in the sixth embodiment of the LCD control system of the invention. In FIG. 7, when each analog switche SWA or SUB is in ON state, each potential $V_{ina}$ or $V_{inb}$ is applied to one end of the capacitor CA. It is supposed here that the potential $V_{ina}$ is lower than the potential $V_{inb}$.

The other end of the capacitor CA is connected to the inverting input terminal A of the operational amplifier 41 through a node at which a potential VB appears. The noninverting input terminal B of the operational amplifier 41 is connected to a potential VC.

One end of the feedback capacitor CB is connected to analog SUE the inverting input terminal A of the operational amplifier 41. An analog switch SWF is connected between a inverting input terminal A and an output terminal $V_{out}$ of the operational amplifier 41. An analog switch SWE is connected between the other end of the feedback capacitor CB and output terminal $V_{out}$. When an analog switch SWD is set in ON state, the potential VD is applied to the feedback capacitor CB.

Concerning the capacitive type DA converter incorporated in thus composed LCD control system of the embodiment in FIG. 7, its operation is described below. Provided that, as shown in Formula (38), the potential VD is supposed to be same as the potential $V_{inb}$, and the potential VC is in the middle between the potential $V_{ina}$, and potential $V_{inb}$.

$$\begin{aligned}&\text{Potential } VD = \text{potential } V_{inb} \\ &\text{Potential } VC = [\text{potential } V_{inb} + \text{potential } V_{ina}]/2\end{aligned} \quad (38)$$

The operation of the capacitive type DA converter consists of the charge cycle of the electric charges into the capacitor CA, and the discharge cycle of the movement of the electric charges from the capacitor CA to the feedback capacitor CB and consequent output of the analog voltage from output terminal $V_{out}$.

First, in the charge cycle, the analog switch SWA, analog switch SWF, and analog switch SWD are in ON state, while the analog switch SWB and analog switch SWE are in OFF state. Accordingly, the potential VA is equal to the potential $V_{ina}$. By the action of the operational amplifier 41, the potential VB and the potential of the output terminal $V_{out}$ are equal to the potential VC. At this time, the potentials at each end of the capacitor CA are the potential VA and potential VB respectively, and the following relation is established.

$$(\text{Potential difference of capacitor } CA) = (\text{potential } V_{ina} - \text{potential } VB) \quad (39)$$

Likewise, as for the feedback capacitor CB, since the potentials at each end are the potential VB and potential VD respectively, their relation is as shown in Formula (40).

$$\begin{aligned}&(\text{Potential difference of capacitor } CB) = \\ &(\text{potential } VD - \text{potential } VB) = \\ &(\text{potential } V_{inb} - \text{potential } VB)\end{aligned} \quad (40)$$

Next, in the discharge cycle, the analog switch SWF and analog switch SWD are set in OFF state, while the analog switch SWE is set on ON state. When the input digital data is 1, the analog switch SWB is set in ON state, and the analog switch SWA is set in OFF state. Accordingly, the potential VA is equal to the potential $V_{inb}$, and the potential difference at both ends of the capacitor CA is as shown in Formula (41).

$$(\text{Potential difference of capacitor } CA) = (\text{potential } V_{inb} - \text{potential } VB) \quad (41)$$

Accordignly, the electric charges having been charged at the negative side electrode of the capacitor. CA are moved to the feedback capacitor CB, and the electric charges are moved to the output terminal $V_{out}$ side (positive side electrode) of the feedback capacitor CB in a manner to cancel this electric charge movement. The moving electric charge quantity $\Delta Q_{CB}$ is expressed in Formula (42).

$\Delta Q_{CB}$=[potential $V_{inb}$–potential $V_{ina}$]×(capacitance of capacitor CA) (42)

The potential VB is not changed because a negative feedback is applied to the operational amplifier 41. Therefore, the potential of the output terminal $V_{out}$ produced as a result of movement of the electric charges becomes as shown in Formula (43).

Potential of output terminal $V_{out}$ = potential $V_{inb}$ – (43)

potential $VB$ + potential $VB$ – [potential $V_{inb}$ – potential $V_{ina}$] × (capacitance of capacitor $CA$)/(capacitance of capacitor $CB$) = potential $V_{inb}$ – [potential $V_{inb}$ potential $V_{ina}$] × (capacitance of capacitor $CA$)/(capacitance of capacitor $CB$)

On the other hand, when the input digital data is 0, the analog switch SWB is set in OFF state, and the analog switch SWA is set in ON state. Accordingly, the electric charges are not moved in the capacitor CA, and the potential of the output terminal $V_{out}$ is in the relation of Potential of output terminal $V_{out}$=potential $V_{inb}$. (44)

The potential difference $V_{1-0}$ of the output terminal $V_{out}$ when the input digital data is 1 and when 0 is $V_{1-0}$ = (potential $V_{ina}$ – potential $V_{inb}$) × (45)

(capacitance of capacitor $CA$)/(capacitance of capacitor $CB$)

In the embodiment in FIG. 7, incidentally, the potential VD is set equal to the potential $V_{inb}$, but it may be, otherwise, set equal to the potential $V_{ina}$.

Thus, in the embodiment in FIG. 7, the analog switch SWE is connected between the output terminal $V_{out}$ of the operational amplifier 41 and the other end of the feedback capacitor CB, and the analog switch SWD is connected between the output terminal $V_{out}$ of the operational amplifier 41 and one end of the feedback capacitor CB so as to apply the same potential as the potential $V_{ina}$ or potential $V_{inb}$, and the potential VC having the middle potential between the potential $V_{ina}$ and potential $V_{inb}$ is applied to the noninverting input terminal B of the operational amplifier 41. Therefore the operating point of the operational amplifier 41 may be set at the middle potential of the potential $V_{ina}$ and potential $V_{inb}$, that is, near the middle of the dynamic range of the operational amplifier 41. It is hence possible to realize the LCD control system resistant to fluctuations of supply voltage and excellent in supply voltage characteristics.

In FIG. 7, meanwhile, the analog switch SWA, analog switch SWB and capacitor CA are disposed by one set each, and the input digital data of one bit is converted into analog signal, but it is also possible to dispose plural sets of analog switch SWA, analog switch SWB and capacitor CA individually to convert into digital data of multiple bits into analog signal. In this case, each capacitance of the plural capacitors CA may FIG. 8 is a structural diagram showing the output circuit in the seventh embodiment of the LCD control system of the invention. When the analog switch SWC is set in ON state, the potential $V_{inc}$ is applied to the capacitor CA. The feedback capacitor CB is connected between the inverting input terminal A and output terminal $V_{out}$ of the operational amplifier 41. The other constitution is same as in the output circuit in the sixth embodiment shown in FIG. 7.

In thus composed capacitive type DA converter incorporated in the LCD control system of the embodiment, the operation is described below. It is supposed, as shown in Formula (46), that the potential VC and potential $V_{inc}$ are a middle potential of the potential $V_{ina}$ and potential $V_{inb}$.

Potential $VC$=potential $V_{inc}$= [potential $V_{inb}$+potential $V_{ina}$]/2 (46)

The operation of the capacitive type DA converter consists of the charge cycle of electric charges into the capacitor CA, and the discharge cycle of movement of the electric charges from the capacitor CA to the feedback capacitor CB and subsequent output from the output terminal $V_{out}$.

In the charge cycle, the analog switch SWC and analog switch SWF are set in ON state, while the analog switch SWA and analog switch SWB are set in OFF state. Accordingly, the potential VA is equal to the potential $V_{inc}$. By the action of the operational amplifier 41, the potential VB and the potential at the output terminal $V_{out}$ are equal to the potential VC. As a result, the potential difference at both ends of the capacitor CA is as shown in Formula (47).

(Potential difference of capacitor $CA$) =potential $V_{inc}$–potential $VB$ (47)

Next, in the discharge cycle, the analog switch SWC and analog switch SWF are set in OFF state.

In this state, when the input digital data is 1, the analog switch SWA remains OFF, while the analog switch SWB is turned on. To the contrary, when the input digital data is 0, the analog switch SWB remains OFF, and the analog switch SWA is turned on. Accordingly, the potential VA is equal to the potential $V_{inb}$ when the input digital data is 1, and equal to the potential $V_{ina}$ when the input digital data is 0.

Therefore, the potential difference at both ends of the capacitor CA, when the input digital data is 1, is as follows.

(Potential difference of capacitor $CA$) =potential $V_{inb}$–potential $VB$ (48)

When the input digital data is 0, the relation is (Potential difference of capacitor $CA$) =potential $V_{ina}$–potential $VB$ (49)

Accordingly, the electric charges having been charged at the negative side electrode of the capacitor CA are moved to the negative side electrode of the feedback capacitor CB, and the electric charges are moved to the output terminal $V_{out}$ side of the feedback capacitor CB in such a manner as to cancel this movement of electric charges. The electric charge quantity $\Delta Q_{CB}$ being moved is, when the input digital data is 1, as follows.

$\Delta Q_{CB}$=[potential $V_{inb}$–potential $V_{inc}$]×(capacitance of capacitor CA) (50)

When the input digital data is 0, the relation is $\Delta Q_{CB}$=[potential $V_{ina}$–potential $V_{inc}$] =(capacitance of capacitor CA) (51)

The potential VB is equal to the potential VC and is not changed because a negative feedback is applied to the operational amplifier 41. Therefore, the potential of the output terminal $V_{out}$ is, when the input digital data is 1, determined as follows from Formula (50).

(Potential of output terminal $V_{out}$) = (52)

potential $VB$ − [potential $V_{inb}$ − potential $V_{inc}$] ×

(capacitance of capacitor $CA$)/(capacitance of capacitor $CB$)

When the input digital data is 0, the relation is (Potential of output terminal $V_{out}$) = (53)

potential $VB$ − [potential $V_{ina}$ − potential $V_{inc}$] ×

(capacitance of capacitor $CA$)/(capacitance of capacitor $CB$)

The voltage difference $V_{1\text{-}0}$ of the output terminal $V_{out}$ when the input digital data is 1 and when 0 is $V_{1-0}$ = [potential $V_{ina}$ − potential $V_{inb}$] × (54)

(capacitance of capacitor $CA$)/(capacitance of capacitor $CB$)

Thus, according to the embodiment in FIG. 8, by installing the analog switch SWC for applying the potential $V_{inc}$ nearly in the middle between the potential $V_{ina}$ and potential $V_{inb}$, and applying the potential VC equal to the voltage nearly in the middle between the potential $V_{ina}$ and potential $V_{inb}$ to the noninverting input terminal B of the operational amplifier 41, first the middle potential $V_{inc}$ is sampled in the charge cycle, and then the output analog voltage may be varied, starting from the middle potential. Accordingly the LCD control system resistant to fluctuations of supply voltage and excellent in supply voltage characteristics may be realized. Besides, since the output analog voltage is also changed from the potential near the central position, a high voltage is hardly applied to the analog switch SWF, and in this respect, too, the LCD control system of stable operation is realized.

In the embodiment in FIG. 8, too, the analog switch SWA, analog switch SWB, and analog switch SWC and capacitor CA may be disposed in plural sets each, and the input digital data of multiple bits may be converted into analog signal. At this time, the plural capacitors CA may be individually weighted.

Thus, in the embodiment shown in FIG. 7, the mutually different first and second potentials are selectively applied to one end of the capacitor according to the input digital data, the other end of the capacitor is connected to the inverting input terminal of the operational amplifier, and a potential nearly in the middle of the first and second potentials is applied to the noninverting input terminal of the operational amplifier, and moreover a potential equal to the first or second potential is applied to the other end of the feedback capacitor of which one end is connected to the inverting input terminal of the operational amplifier.

Besides, in the embodiment shown in FIG. 8, the mutually different first and second potentials, and a third potential having a potential near the middle of the first and second potentials are selectively applied to one end of the capacitor according to the input digital data, and the other end of the capacitor is connected to the inverting input terminal of the operational amplifier, and a same potential as the third potential is applied to the noninverting input terminal of the operational amplifier, and a feedback capacitor is connected between the inverting input terminal and output terminal of the operational amplifier.

By so constituting, the operating point of the operational amplifier may be set at a middle potential of the first and second potentials, and the operational amplifier may be operated nearly in the middle of its dynamic range. Hence, the LCD control system resistant to fluctuations of supply voltage and excellent in supply voltage characteristics may be realized.

An eighth embodiment of the LCD control system of the invention is described below.

In the LCD control system which repeats the charge cycle and discharge cycle periodically, the duration of the charge cycle is longer because the load by a large capacitance is charged and discharged in the charge cycle. As a result, the discharge cycle time is relatively shorter, and the power consumption increases by charging and discharging the load capacitor.

The eighth embodiment of the invention is intended to solve the above problems, and presents an LCD control system capable of shortening the charge cycle time and saving the power consumption.

In other words, in the embodiment, a switch for connecting and disconnecting the load is connected between the output terminal of the operational amplifier of the output circuit comprising a DA converter and the load capacitor of the liquid crystal panel, and this switch is set in OFF state in the charge cycle.

In this constitution, in the charge cycle, the load capacitor of the operational amplifier is cut off, and the load of the operational amplifier may be reduced, so that the operational amplifier may operate at high speed, while the power consumption is saved. Incidentally, in the discharge cycle, the switch for load connection and disconnection is set in ON state, and the load is connected to the output terminal of the operational amplifier, so that the liquid crystal capacitors of the liquid crystal panel may be charged and discharged as usual, and a desired display may be appeared.

The eighth embodiment of the output circuit comprising a DA converter for composing the LCD control system of the invention is described below while referring to FIG. 9 to FIG. 12.

Figure 9:
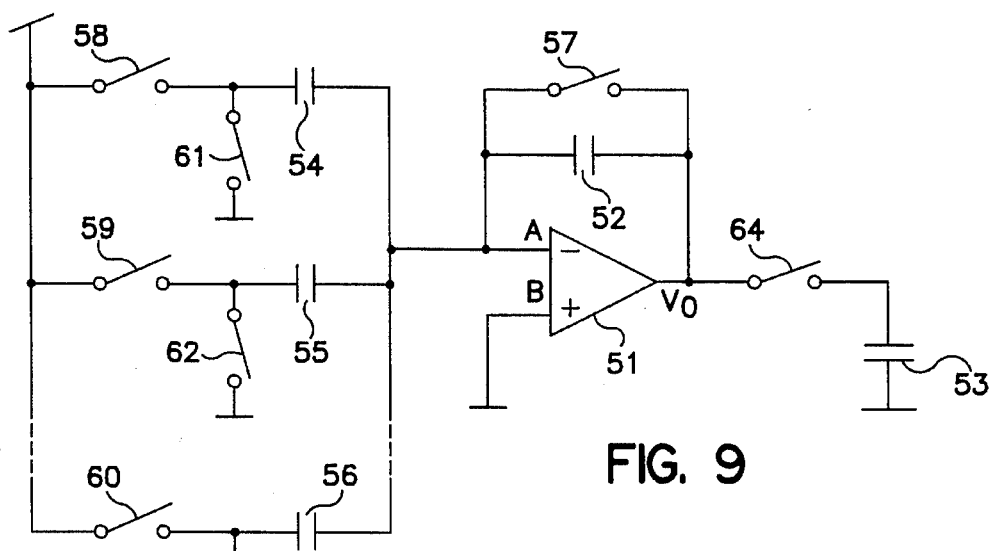
FIG. 9 is a structural diagram showing an output circuit in an eighth embodiment for composing the LCD control system of the invention.

FIG. 9 is a structural diagram showing the output circuit in the eighth embodiment of the LCD control system of the invention. In FIG. 9, a capacitor 52 is connected between the output terminal and inverting input terminal A of an operational amplifier 51, and functions as a negative feedback circuit, and a load capacitor 53 comprises a liquid crystal capacitor and wiring capacitor of the TFT liquid crystal panel (corresponding to the TFT liquid crystal panel 1 in FIG. 1). Plural capacitors 54 to 56 have their one end each connected to the inverting input terminal A of the operational amplifier 51. A switch 57 is connected between the output terminal and the inverting input terminal A of the operational amplifier 51. Switches 58 to 60 are connected between the other ends of the capacitors 54 to 56 and the power source terminal, and switches 61 to 63 are connected between the other ends of the capacitors 54 to 56 and the ground.

In the diagram, the switches 57 to 63 are shown in a form of mechanical switches, but actually they are analog switches becoming ON or OFF depending on the digital input data.

In the embodiment, a switch 64 for connection or disconnection of the load is connected between the output terminal of the operational amplifier 51 and the load capacitor 53. This switch 64 is also an analog switch turned on or off by the digital input data.

In thus composed LCD control system in FIG. 9, its operation is described below.

in this LCD control system, too, the basic operation consists of charge cycle and discharge cycle.

First the charge cycle is explained. In the charge cycle, the switch 57 is set in ON state, and the output terminal and inverting input terminal A of the operational amplifier 51 are short-circuited. At this time, the operational amplifier 51 works as voltage follower circuit.

In the charge cycle, moreover, the switch 64 for connecting and disconnecting the load is set in OFF state, and the load capacitor 53 is separated from the output terminal of the operational amplifier 51.

Figure 10:
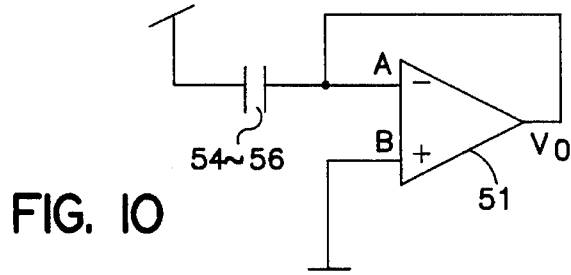
FIG. 10 is an equivalent circuit diagram in charging operation of the output circuit in FIG. 9, FIGS. 11A, 11B are equivalent circuit diagrams in output operation of analog signal in the output circuit in FIG. 9.

In this state, the switches 58 to 60 are set in ON slate, and the switches 61 to 63 are set in OFF state. At this time, the equivalent circuit is as shown in FIG. 10. Since the inverting input terminal A of the operational amplifier 51 is assumed to be grounded, the supply voltage is applied to the capacitors 54 to 56.

At this time, the load capacitor 53 is not connected to the output terminal of the operational amplifier 51, and the output terminal of the operational amplifier 51 is directly connected to the inverting input terminal A which is assumed to be grounded. Accordingly, a stable state is established in a short time. In the stable state, the output voltage $V_0$ of the operational amplifier 51 is at the ground level.

The discharge cycle is described below. Only three capacitors 54 to 56 are shown in FIG. 9, but actually there are as many as the number of bits of the digital input data that is entered, and therefore the switches 58 to 63 are also as many as the number of bits actually. In the discharge cycle, the switches 58 to 63 are set in OFF state or in ON state depending on the digital input data for liquid crystal display, and the electric charges stored in the capacitors 54 to 56 are discharged depending on the digital data.

In the discharge cycle, moreover, the switch 64 for connecting and disconnecting the load connected to the output terminal of the operational amplifier 51 is set in ON state, and the load capacitor 53 is connected to the output terminal of the operational amplifier 51.

Figure 11A:
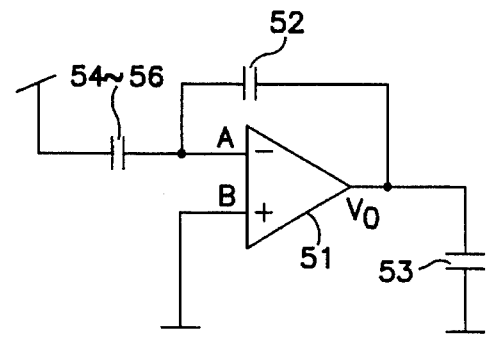

When the digital input data is 0, as shown in FIG. 11A, the capacitors 54 to 56 remain connected to the power source terminals. At this time, since there is no change in the input voltage at the inverting input terminal A of the operational amplifier 51, the output voltage $V_0$ of the output terminal remains at the ground level.

Figure 11B:
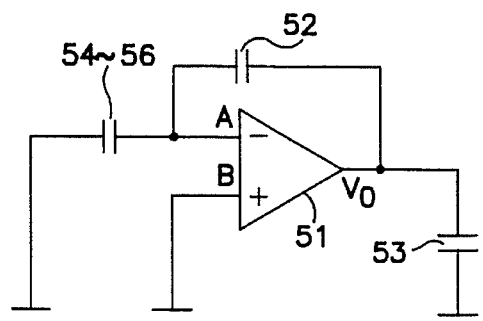

On the other hand, when the digital datas are all 1, as shown in FIG. 11B, the capacitors 54 to 56 are connected to the ground. At this time, the input voltage of the inverting input terminal A of the operational amplifier 51 is changed in the negative direction against the ground, and hence the output voltage of the operational amplifier 51 is changed in the positive direction, thereby raising the output voltage $V_0$ of the output terminal. This output voltage $V_0$ is applied to the load capacitor (the liquid crystal capacitor of the liquid crystal panel) 53 through the switch 64 for connecting and disconnecting the load, so that the display corresponding to the input data is appeared.

Figure 12:
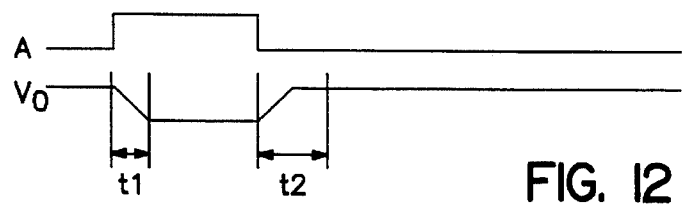
FIG. 12 is an operation timing chart of the output circuit in FIG. 9.

FIG. 12 is a timing chart showing with the charging operation and the discharge operation when the input data is 1 in the embodiment in FIG. 9. In FIG. 12, $t_1$ denotes the time until the charge cycle shown in FIG. 10 is completed, and $t_2$ is the time until the discharge cycle is completed.

In the LCD control system in FIG. 9, since the load capacitor 53 is separated from the output terminal of the operational amplifier 51 at the time of charging, the charge cycle time $t_1$ can be shortened.

Thus, in the embodiment in FIG. 9, in the LCD control system repeating the charge cycle and discharge cycle periodically, the operating speed can be accelerated by separating the load from the output terminal of the operational amplifier in charge cycle. Besides, since the load capacitor is not charged or discharged in the charge cycle, the power consumption may be reduced.

A ninth embodiment of output circuit for composing the LCD control system of the invention is described below by referring to FIG. 13 and FIG. 14.

Figure 13:
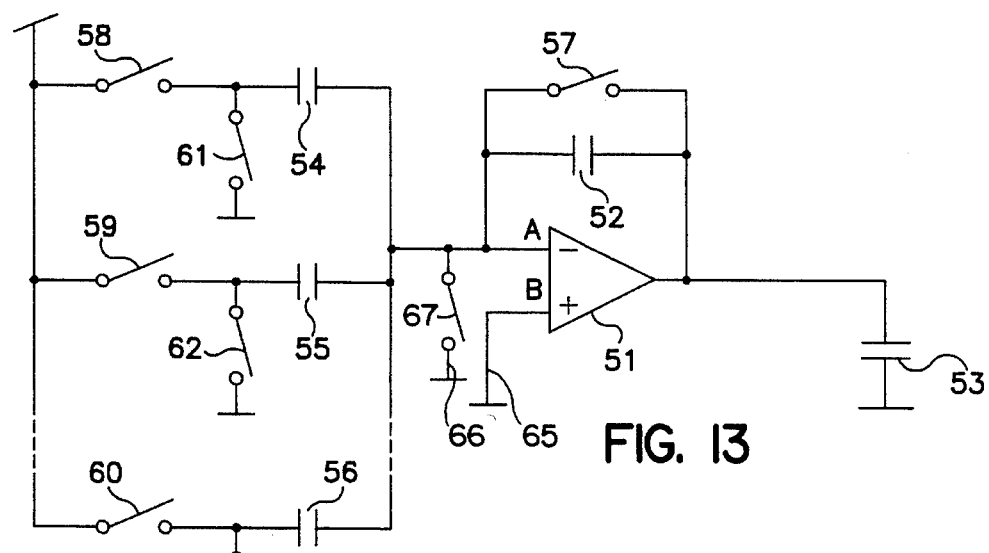
FIGS. 13 is a structural diagram showing an output circuit in a ninth embodiment for composing the LCD control system of the invention.
Figure 14:
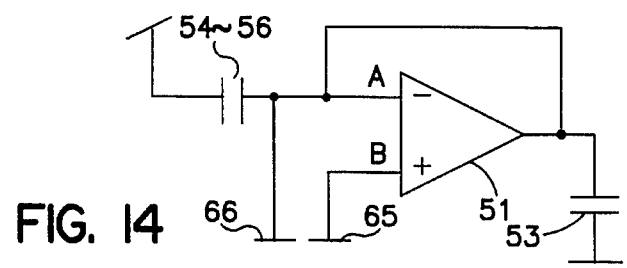
FIG. 14 is an equivalent circuit diagram in charging operation of the output circuit in FIG. 13.

In FIG. 13, a reference power source 65 is connected to a noninverting input terminal B of an operational amplifier 51. A reference power source 66 is at the same potential as the reference power source 65. A switch 67 is connected between an inverting input terminal A of the operational amplifier 51 and the reference power source 66, and it is an electronic switch turned on or off by a digital signal. Except for the switch 64 for connecting and disconnecting the load, the other constitution is same as in the output circuit in the embodiment shown in FIG. 9.

In thus composed LCD control system in FIG. 13, its operation is explained below.

In this LCD control system, too, the basic operation consists of charge cycle and discharge cycle.

First the charge cycle is explained. In the charge cycle, the switch 57 is set in ON state, and the output terminal and inverting input terminal A of the operational amplifier 51 are short-circuited. At this time, the operational amplifier 51 works as voltage follower circuit. Furthermore, in the charge cycle, the switch 67 for the reference power source is set in ON state.

In this state, the switches 58 to 60 are set in ON state, and the switches 61 to 63 are set in OFF state. At this time, the equivalent circuit becomes as shown in FIG. 14. Since the inverting input terminal A of the operational amplifier 51 is assumed to be grounded, the supply voltage is applied to the capacitors 54 to 56.

To the inverting input terminal A of the operational amplifier 51, the reference power source 66 at the same potential as the reference power source 65 is connected. To the load capacitor of the feedback circuit, the reference power source of a large output current and a stable voltage is connected, so that a stable state is established in a short time. In the stable state, the output voltage $V_0$ of the operational amplifier 51 is at the ground level.

The discharge cycle is explained. Only three capacitors 54 to 56 are shown in FIG. 13, but actually there are as many as the number of bits of the digital input data that is entered, and the switches 58 to 63 are also as many as the number of bits. In the discharge cycle after opening the switche 67 for reference power source, the switches 58 to 63 are set in ON or OFF state depending on the digital input data for liquid crystal display, and the electric charges stored in the capacitors 54 to 56 are discharged depending on the digital input data. In the discharge cycle, switches 58 to 63 are set in ON or OFF state, the electric charges stored in the capacitors 54 to 56 are moved into the capacitor 52, and an analog voltage depending on the digital input data is generated.

In the embodiment in FIG. 13, too, same as in the embodiment in FIG. 9, the charge cycle time $t_1$ in FIG. 12 may be shortened.

Thus, in the embodiment in FIG. 13, by connecting the reference power source to the input terminal of the operational amplifier at the time of charge cycle, the charging speed to the load capacitor of the feedback circuit may be accelerated.

The output circuits of the LCD control system in the foregoing embodiments are all composed of capacitive type DA converter, but it may be also possible to compose by using resistors, current source or oversampling.

Figure 15:
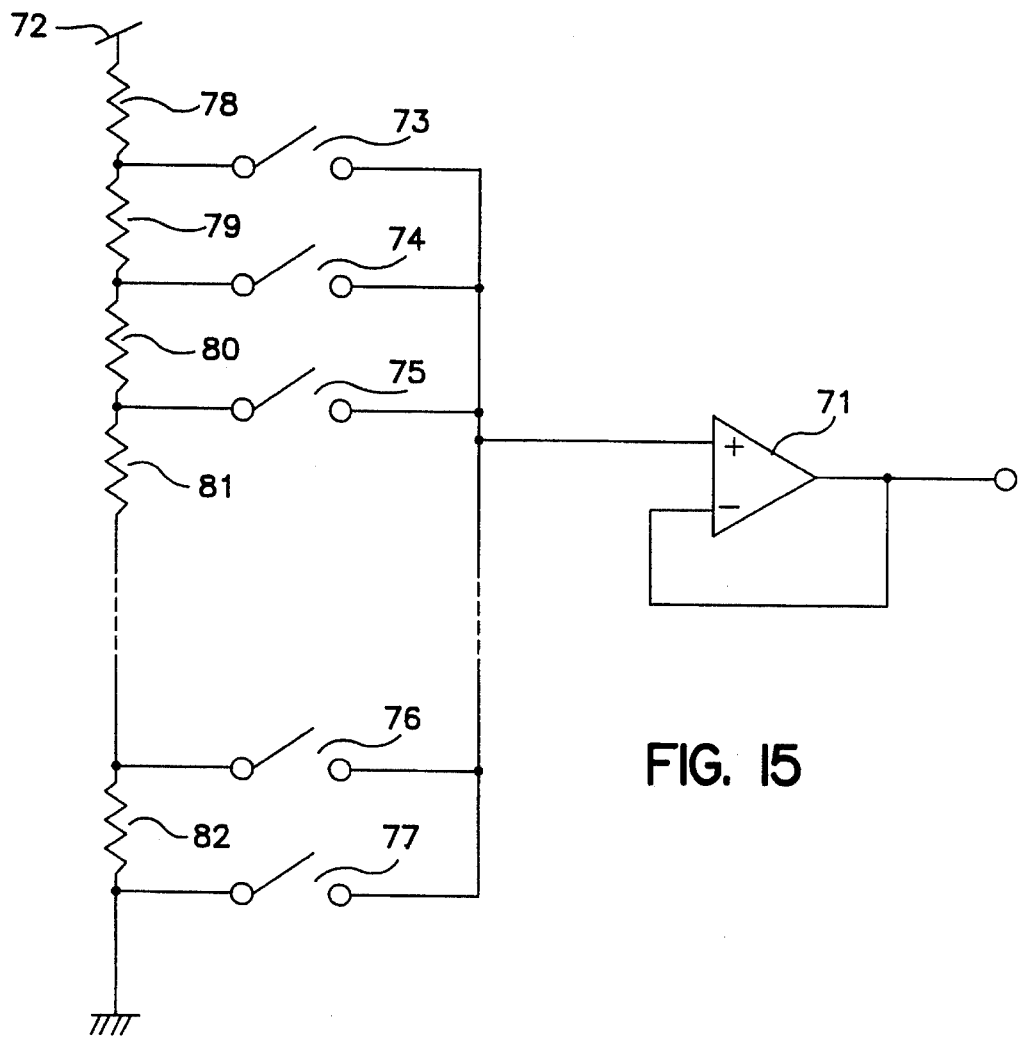
FIG. 15 is a structural diagram showing an output circuit using a resistance type DA converter in a tenth embodiment for composing the LCD control system of the invention.

Referring to FIG. 15, a tenth embodiment of an output circuit composed of a DA converter using resistors is explained below.

The switches 73 to 77 are turned on or off depending on the weight of the digital gray scale data. The resistors 78 to 82 divide the reference voltage 72, and generate gray scale voltages. Of the plural gray scale voltages generated by dividing, one gray scale voltage corresponding to the digital gray scale data is selected by one of the switches 73 to 77. The selected gray scale voltage is delivered through an operational amplifier 71 functioning as a voltage follower circuit.

The resistance type DA converter in FIG. 15 divides the reference voltage by plural resistors, and generates gray scale voltages and selects, among these gray scale voltages, the gray scale voltage depending on the digital gray scale data by the switches.

In the embodiment in FIG. 15, all resistance values of resistors are equal, but the number of resistors may be decreased by using a resistor having the resistance value proportional to the factorial of bits.

An eleventh embodiment of an output circuit composed of a DA converter using resistors is shown below while referring to FIG. 16.

The switches 94 to 97 are turned on or off depending on the digital gray scale data. Supposing all resistance values of input resistors 98 to 101 to be equal, the input currents flowing in the input resistances are all equal. The switches 94 to 97 are as many as the number of gray scales. When the switches 94 to 97 in the number corresponding to the digital gray scale data are set in ON state, an input current corresponding to the gray scale flows into the feedback resister 92. An output voltage corresponding to the input current is generated by the operational amplifier 91 and the feedback resister 92 functioning as current/voltage conversion circuit.

Figure 16:
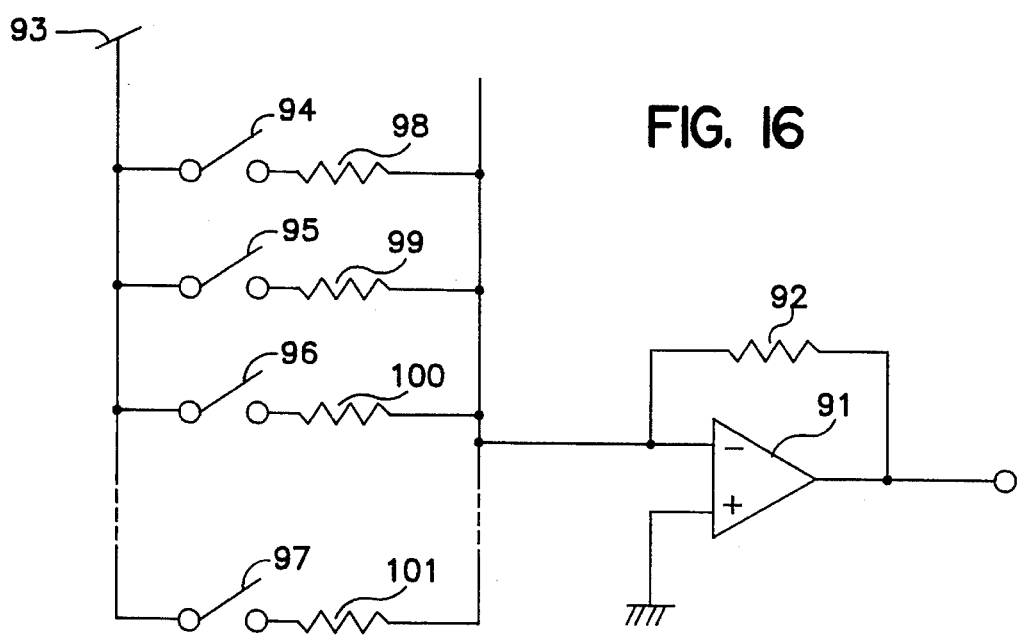
FIG. 16 is a structural diagram showing an output circuit using a resistance type DA converter in an eleventh embodiment for composing the LCD control system of the invention.

In the-embodiment in FIG. 16, the resistance values of all input resistors are equal, but the number of resistors may be decreased by using the resistor having a resistance value proportional to the factorial of bits.

A twelfth embodiment of an output circuit composed of a DA converter using constant current source is described below by reference to FIG. 17.

The switches 114 to 117 are turned on or off depending on the digital gray scale data. The constant current sources 118 to 121 as many as the number of gray scales are provided. Some of the constant current sources 118 to 121 are selected by some of the switches 114 to 117. The selected constant current sources are delivered by the operational amplifier 111 and the feedback resistance 112 functioning as current/ voltage conversion circuit.

Figure 17:
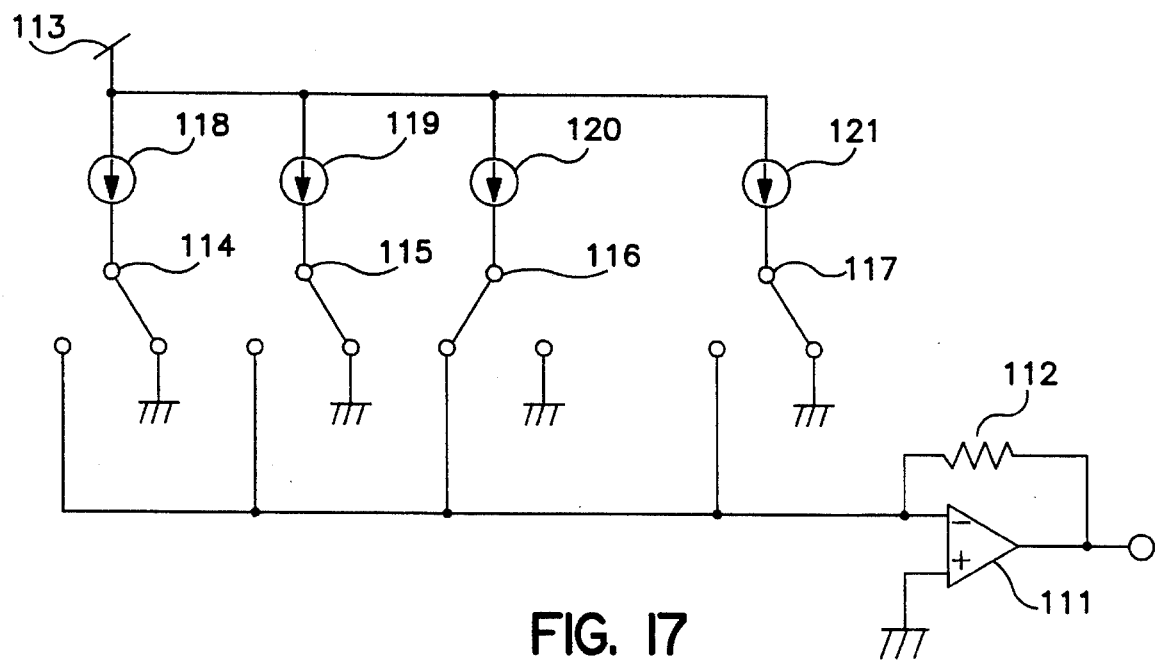
FIG. 17 is a structural diagram showing an output circuit using a current source type DA converter in a twelfth embodiment for composing the LCD control system of the invention.

In the embodiment in FIG. 17, all current values of constant current sources are equal, but the number of constant current sources may be decreased by using a constant current source having the current value proportional to the factorial of bits.

A thirteenth embodiment of an output circuit composed of a DA converter using oversampling method is explained below by reference to FIG. 18.

Figure 18:
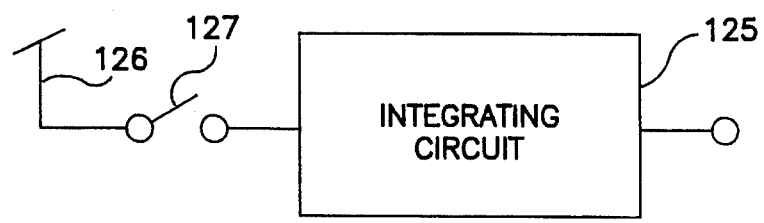
FIG. 18 is a structural diagram showing an output circuit using a over-sampling method DA converter in a thirteenth embodiment for composing the LCD control system of the invention.
Figure 19:
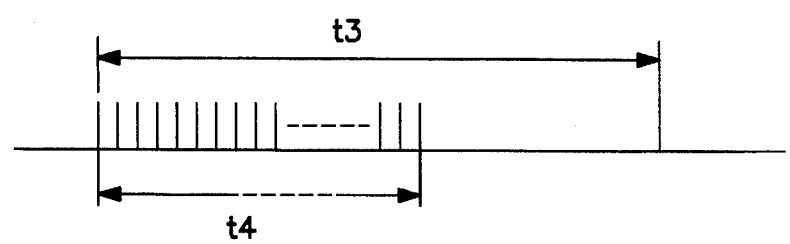
FIG. 19 is a timing chart for explaining the operation of the output circuit in FIG. 18.
Figure 20:
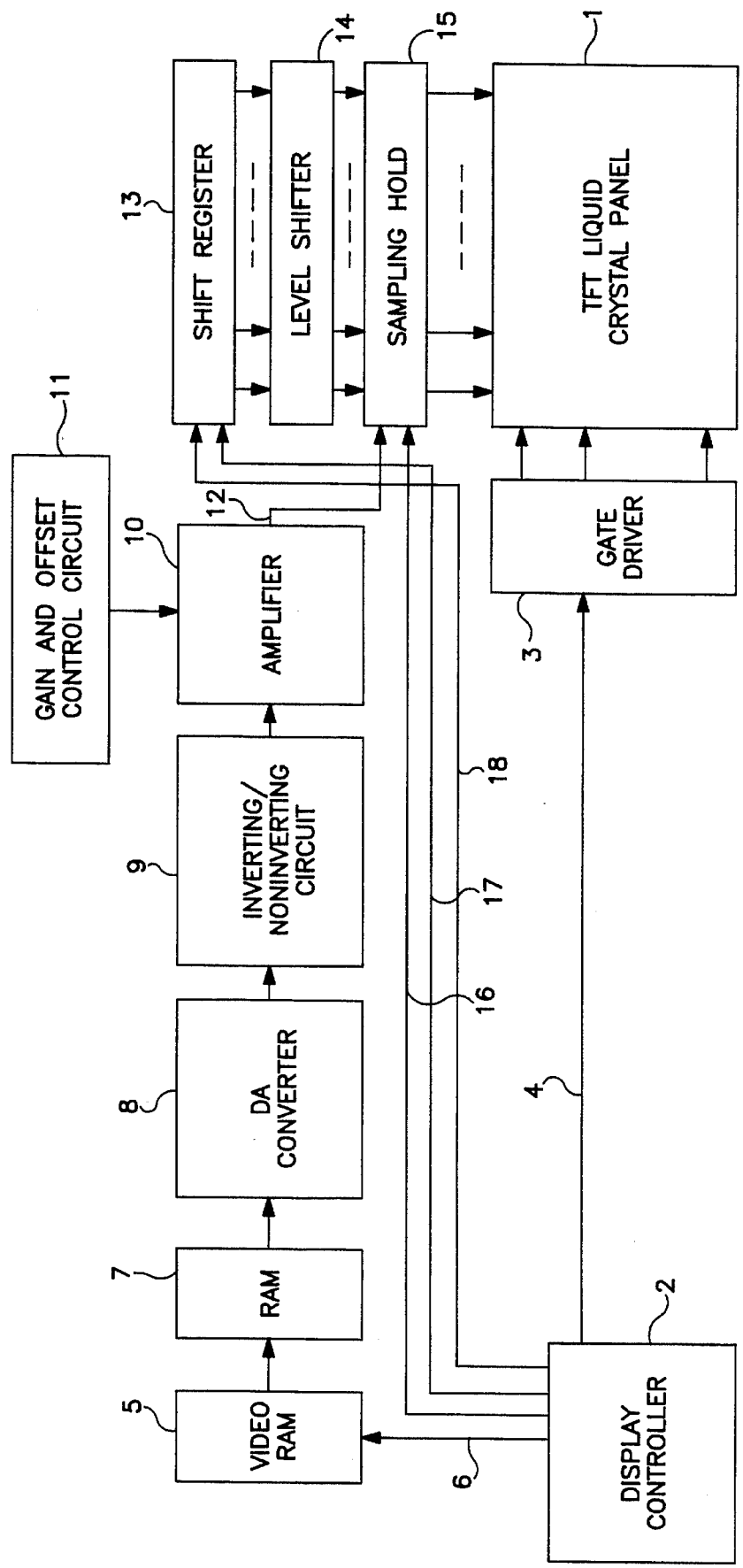
FIG. 20 is a block diagram showing the constitution of a conventional LCD control system.

In the embodiment in FIG. 18., the digital gray scale data is not transferred parallel, but is transferred serially. Examples of serial data are shown in FIG. 19. FIG. 19 is an example of transferring the pulse strings $t_4$ equal to the gray scale value of the digital gray scale data in a specific cycle $t_3$. By the transfer serial data in FIG. 19, the switch 127 in FIG. 18 is turned on and off, a constant electric charge is moved from the reference voltage 126 to the integrating circuit 125. As a result, a voltage in an amplitude proportional to the digital gray scale data is generated in the integrating circuit 125.

According to the LCD control system of the invention, by disposing the DA converter immediately before the liquid crystal panel and processing the gray scale data directly in digital form without having to processing into analog form, the high speed analog circuit and regulating circuit may be omitted, and a display picture of high quality is obtained.

By employing the data latch means for storing the gray scale data and the adjustment-free DA converter for converting the output of digital data latch means into analog signal to be applied to the liquid crystal panel, the high speed analog circuit and regulating circuit are not needed, and the adjusting circuits necessary in the amplifier and the like may be reduced, so that the mass producibilty may be enhanced.

According to the output circuit used in the LCD control system of the invention, by turning on or off the switches depending on the bit information of digital signal, charging and discharging of capacitors may be realized by a reffference voltage, and a necessary output voltage is generated, and it is hence not necessary to use many reference voltages. Therefore,the number of wirings and number of circuits may be reduced.

We claim:

1. A DA converter for liquid crystal display control system comprising:
   a. input means for entering n-bit digital signals of information where n is a positive integer number,
   b. a capacitor group including n capacitors connected in parallel,
   c. a switch group of switches for controlling charge and discharge of said capacitors, which is connected to said capacitors of said capacitor group to be turned on or off depending on bit information contained in said digital signals, and
   d. an amplifier for generating an output voltage proportional to the voltage generated by the electric charges of the capacitor charged according to said bit information of said digital signals out of said capacitors in said capacitor group, said amplifier including (1) an inverting input terminal, (2) a negative feed back capacitor having (a) a first electrode coupled to said inverting input terminal and (b) a second electrode, (3) an output terminal, (4) a non-inverting input terminal, and (5) means for selectively connecting said second electrode to said output terminal and said non-inverting input terminal.

2. A DA converter for liquid crystal display control system comprising:
   a. input means for entering digital signals of n×m bits of information where n and m are positive integer numbers,
   b. a capacitor group including m sets of n capacitors connected in parallel,
   c. a switch group of switches for controlling charge and discharge of said n capacitors, said switch group connected to said n capacitors of said capacitor group, said switches to be turned on or off depending on the bit information of said digital signals, d. a power source group of power sources provided in each one of said m sets of capacitors for supplying a voltage of $2^{(-n) \times 0}$ to $2^{(-n) \times (m-1)}$ of a specified reference voltage to each one of said n capacitors in each one of said m sets of capacitors, and e. an amplifier for generating an output voltage proportional to the voltage generated by the electric charges of each one of said n capacitors charged by each one of said power sources of the power source group according to the n×m bits of information of said digital signal, said amplifier including (1) an inverting input terminal, (2) a negative feedback capacitor having (a) a first electrode coupled to said inverting input terminal and (b) a second electrode, (3) an output terminal, (4) a non-inverting input terminal, and (5) means for selectively connecting said second electrode to said output terminal and said non-inverting input terminal.

3. A DA converter for liquid crystal display control system comprising:

a. input means for entering digital signals of n×m bits of information where n and m are positive integer numbers, b. a capacitor group including m sets of n capacitors connected in parallel, c. a switch group of switches for controlling charge and discharge of said n capacitors, said switch group connected to said n capacitors of said capacitor group, said switches to be turned on or off depending on the bit information of said digital signals, d. (m−1) dividing capacitors connected in series with (m−1) sets of said m sets of capacitors excluding a set of said m sets of capacitors corresponding to the most significant n bits of said digital signal, said (m−1) dividing capacitors also connected in parallel with the set of said m sets of capacitors corresponding to the most significant n bits of said digital signal, and e. an amplifier for generating an output voltage proportional to the voltage generated by the electric charges of each one of said n capacitors charged by each one of said power sources of the power source group according to the n×m bits of information of said digital signal.

4. A DA converter for liquid crystal display control system comprising:

a. input means for entering digital signals of n×m bits of information where n and m are positive integer numbers, b. a capacitor group including m sets of n capacitors connected in parallel, c. a switch group of switches for controlling charge and discharge of said n capacitors, said switch group connected to said n capacitors of said capacitor group, said switches to be turned on or off depending on the bit information of said digital signals, d. (m−1) dividing capacitors connected in series with (m−1) sets of said m sets of capacitors excluding a set of said m sets of capacitors corresponding to the most significant n bits of said digital signal, said (m−1) dividing capacitors also connected in parallel with the set of said m sets of capacitors corresponding to the most significant n bits of said digital signal, e. an amplifier for generating an output voltage proportional to the voltage generated by the electric charges of each one of said n capacitors charged by each one of said power sources of the power source group according to the n×m bits of information of said digital signal, and f. (m−1) switches connected in parallel with said (m−1) dividing capacitors respectively.

5. A DA converter for liquid crystal display control system comprising:

a. a capacitor, b. first and second switches for selectively applying mutually different first and second potentials to one end of said capacitor according to a digital signal, c. an amplifier having its inverting input terminal connected to the other end of said capacitor, in which a potential near the middle of the first and second potentials is applied to its positive input terminal, d. a third switch connected between said inverting input terminal and output terminal of said amplifier, e. a feedback capacitor having one end connected to said inverting input terminal of said amplifier, f. a fourth switch connected between the other end of said feedback capacitor and said output terminal of said amplifier, and g. a fifth switch connected between said other end of said feedback capacitor and a potential point having a potential same as said first or second potential.

6. A DA converter for liquid crystal display control system comprising:

a. an amplifier, b. a capacitor functioning as a negative feedback circuit of said amplifier, c. plural capacitor groups connected parallel to an inverting input terminal of said amplifier, d. plural switch groups connected to the capacitors of said capacitor groups, which are turned on or off according to the digital signals for a liquid crystal display to control charge and discharge of said capacitors, thereby varying the electric charges of each capacitor, e. a reference power source applied to a positive input terminal of said amplifier, and f. a switch for applying a voltage equal to said reference power source to one input terminal of said amplifier, wherein g. the charging action on said plural capacitor groups and the output action of analog signals are determined to be repeated periodically, and said switch for applying a voltage equal to said reference power source to said inverting input terminal of said amplifier is set in an ON state in a specific period of the charging action, and is set in an OFF state in the output action.

* * * * *